United States Patent
Mashimo et al.

(10) Patent No.: US 10,501,369 B2
(45) Date of Patent: Dec. 10, 2019

(54) TRANSLUCENT SUBSTRATE, ORGANIC LED ELEMENT AND METHOD OF MANUFACTURING TRANSLUCENT SUBSTRATE

(71) Applicant: AGC Inc., Tokyo (JP)

(72) Inventors: Takahiro Mashimo, Tokyo (JP); Naoto Kihara, Tokyo (JP); Kazunobu Maeshige, Tokyo (JP); Teruo Fujiwara, Tokyo (JP); Masahiro Kishi, Tokyo (JP); Nobuhiro Nakamura, Tokyo (JP); Mamoru Isobe, Tokyo (JP)

(73) Assignee: AGC Inc., Tokyo (JP)

( * ) Notice: Subject to any disclaimer, the term of this patent is extended or adjusted under 35 U.S.C. 154(b) by 438 days.

(21) Appl. No.: 14/933,156

(22) Filed: Nov. 5, 2015

(65) Prior Publication Data

US 2016/0060162 A1    Mar. 3, 2016

Related U.S. Application Data

(63) Continuation of application No. PCT/JP2014/060550, filed on Apr. 11, 2014.

(30) Foreign Application Priority Data

May 9, 2013 (JP) .................. 2013-099112
Dec. 18, 2013 (JP) .................. 2013-261821

(51) Int. Cl.
*C03C 17/34* (2006.01)
*H01L 51/00* (2006.01)
(Continued)

(52) U.S. Cl.
CPC ...... *C03C 17/3411* (2013.01); *C03C 17/3417* (2013.01); *C03C 17/361* (2013.01);
(Continued)

(58) Field of Classification Search
CPC ............... C03C 17/3411; C03C 17/361; C03C 17/3626; C03C 2217/94; C03C 2217/948;
(Continued)

(56) References Cited

U.S. PATENT DOCUMENTS 6,091,196 A        7/2000  Codama
2001/0019244 A1*   9/2001  Yamazaki ............. H05B 33/28
                                                      313/506
(Continued)

FOREIGN PATENT DOCUMENTS

JP    7-281209    10/1995
JP    11-145495    5/1999
(Continued)

OTHER PUBLICATIONS

Office Action dated Jun. 27, 2017 in Japanese Patent Application No. 2015-515827 (with English language translation).
(Continued)

*Primary Examiner* — Sophie Hon
(74) *Attorney, Agent, or Firm* — Oblon, McClelland, Maier & Neustadt, L.L.P.

(57) ABSTRACT

A translucent substrate includes a glass substrate containing at least one element selected from a group consisting of Bi, Ti and Sn; a coating layer formed on the glass substrate; and a transparent conductive film formed on the coating layer, wherein the coating layer is deposited by a dry depositing method.

17 Claims, 3 Drawing Sheets

(51) Int. Cl.
*H01L 31/0224* (2006.01)
*H01L 51/52* (2006.01)
*C03C 17/36* (2006.01)
*C03C 25/226* (2018.01)
*C23C 14/00* (2006.01)
*H01L 51/44* (2006.01)

(52) U.S. Cl.
CPC ........ *C03C 17/3626* (2013.01); *C03C 25/226* (2013.01); *C23C 14/0036* (2013.01); *C23C 14/0084* (2013.01); *H01L 31/022475* (2013.01); *H01L 51/0096* (2013.01); *H01L 51/5268* (2013.01); *C03C 2217/94* (2013.01); *C03C 2217/948* (2013.01); *C03C 2218/153* (2013.01); *C03C 2218/155* (2013.01); *H01L 51/442* (2013.01); *H01L 51/5215* (2013.01); *H01L 2251/301* (2013.01); *H01L 2251/308* (2013.01); *H01L 2251/558* (2013.01); *Y02E 10/549* (2013.01); *Y02P 70/521* (2015.11); *Y10T 428/1095* (2015.01)

(58) Field of Classification Search
CPC ............ C23C 14/0036; C23C 14/0084; H01L 2251/303–2251/306; H01L 2251/308; H01L 51/0096; H01L 51/442; H01L 51/5215; H01L 51/5268; H01L 51/5203; H01L 51/5206; Y10T 428/1095
See application file for complete search history.

(56) References Cited

U.S. PATENT DOCUMENTS

| | | |
|---|---|---|
| 2003/0072890 A1 | 4/2003 | Miyazawa |
| 2004/0229465 A1 | 11/2004 | Kiyota et al. |
| 2004/0263441 A1* | 12/2004 | Tanaka ................... G09G 3/325 345/76 |
| 2006/0141136 A1 | 6/2006 | Miyazawa |
| 2009/0153972 A1 | 6/2009 | Nakamura et al. |
| 2011/0001159 A1* | 1/2011 | Nakamura ............. B82Y 20/00 257/98 |
| 2011/0278622 A1 | 11/2011 | Wada et al. |
| 2011/0287264 A1 | 11/2011 | Wada et al. |
| 2013/0049046 A1 | 2/2013 | Moon et al. |
| 2013/0114269 A1* | 5/2013 | Domercq ............ H01L 51/5215 362/311.05 |
| 2013/0187141 A1 | 7/2013 | Nakamura et al. |
| 2013/0233386 A1 | 9/2013 | Hanawa et al. |

FOREIGN PATENT DOCUMENTS

| | | |
|---|---|---|
| JP | 2005-268616 A | 9/2005 |
| JP | 2005268616 A * | 9/2005 |
| JP | 2008-30972 | 2/2008 |
| JP | 2010-198797 A † | 9/2010 |
| JP | 2010-215426 | 9/2010 |
| JP | 2016-515950 A | 6/2016 |
| WO | WO 02/098812 | 12/2002 |
| WO | WO 2009/017035 | 2/2009 |
| WO | WO 2010/084922 | 7/2010 |
| WO | WO 2010/084925 | 7/2010 |
| WO | WO 2012/007575 A1 | 1/2012 |
| WO | WO 2012/053549 | 4/2012 |
| WO | 2012/057043 A1 † | 5/2012 |
| WO | WO 2012/057043 A1 | 5/2012 |
| WO | WO 2014/131980 A1 | 9/2014 |

OTHER PUBLICATIONS

International Search Report dated Jul. 15, 2014, in PCT/JP2014/060550 filed Apr. 11, 2014.
P. Grayhurst: "Glass packaging", Packaging Technology, Elsevier, XP055357667, Oct. 29, 2012, p. 109.

* cited by examiner
† cited by third party

TRANSLUCENT SUBSTRATE, ORGANIC LED ELEMENT AND METHOD OF MANUFACTURING TRANSLUCENT SUBSTRATE

CROSS-REFERENCE TO RELATED APPLICATION

This application is a continuation application filed under 35 U.S.C. 111(a) claiming the benefit under 35 U.S.C. 120 and 365(c) of PCT International Application No. PCT/JP2014/060550 filed on Apr. 11, 2014, which is based upon and claims the benefit of priority of Japanese Priority Application No. 2013-099112 filed on May 9, 2013, and Japanese Priority Application No. 2013-261821 filed on Dec. 18, 2013, the entire contents of which are hereby incorporated by reference.

BACKGROUND OF THE INVENTION

Field of the Invention

The present invention relates to a translucent substrate, an organic LED element and a method of manufacturing a translucent substrate.

Organic LED (Light Emitting Diode) elements are widely used for displays, backlights, illuminations and the like.

A general purpose organic EL element includes a first electrode (anode) and a second electrode (cathode) provided on glass substrates, respectively, and an organic light emitting layer provided between these electrodes. When applying a voltage between the electrodes, holes and electrons are injected into the organic light emitting layer from the corresponding electrodes. When the holes and the electrons are recombined in the organic light emitting layer, binding energy is generated to excite organic luminescent materials in the organic light emitting layer. As light emissions occur when the excited luminescent materials return to the ground state, a luminescent (LED) element is obtained by using this phenomenon.

Generally, a transparent conductive layer such as ITO (Indium Tin Oxide) is used for the first electrode, the anode in other words, and a metal electrode layer such as aluminum, silver or the like is used for the second electrode, the cathode in other words.

Generally, when manufacturing the organic LED element, a transparent conductive layer is formed on a glass substrate containing Bi or the like, as the first electrode. A member configured by forming the transparent conductive layer on the glass substrate is often referred to as a "translucent substrate". The "translucent substrate" is used as a semi-finished product before obtaining a product such as an organic LED element or the like, for example.

Here, Patent Document 1 discloses that for an optical glass whose main constituent is $Bi_2O_3$, under non-oxidizing atmosphere, bismuth in a glass component is reduced and bismuth suboxide, metal bismuth or the like is deposited, which causes coloring (black) or surface roughness. Then, it is said that such coloring or surface roughness causes lowering of transmittance in addition to causing defects at a glass surface.

PATENT DOCUMENT

[Patent Document 1] Japanese Laid-open Patent Publication No. 2010-215426

As disclosed in the above described Patent Document 1, there is a case that a glass substrate containing Bi or the like is discolored or the like by an ambient environment. Further, according to the studies by the present inventors, it is recognized that a phenomenon of generation of coloring on the glass substrate occurs when forming an ITO film on the glass substrate.

Such coloring of the glass substrate affects largely the characteristics of the translucent substrate, and further affects the characteristics of the organic LED element. For example, when using the organic LED element including the glass substrate in which coloring is generated, a problem may occur such as the light generated in the organic light emitting layer is absorbed inside the element and the light extracting efficiency is greatly lowered.

SUMMARY OF THE INVENTION

The present invention is made in light of the above problems, and provides a translucent substrate in which generation of coloring is significantly suppressed and an organic LED element including such a translucent substrate. Further, according to the invention, a method of manufacturing a translucent substrate is provided in which generation of coloring is significantly suppressed.

According to the invention, there is provided a translucent substrate including a glass substrate containing at least one element selected from a group consisting of Bi, Ti and Sn; a coating layer formed on the glass substrate; and a transparent conductive film formed on the coating layer, wherein the coating layer is deposited by a dry depositing method.

Further, according to the invention, there is provided a translucent substrate including a glass substrate; a scattering layer formed on the glass substrate and containing at least one element selected from a group consisting of Bi, Ti and Sn; a coating layer formed on the scattering layer; and a transparent conductive film formed on the coating layer, wherein the coating layer is deposited by a dry depositing method.

In the translucent substrate of the embodiment, the coating layer may contain oxide containing one or more elements selected from Si, Al, Ti, Nb, Zr, Sn, Ta and W.

In the translucent substrate of the embodiment, the coating layer may contain nitrogen oxide containing one or more elements selected from Si, Al, Ti, Nb, Zr, Sn, Ta and W.

In the translucent substrate of the embodiment, the coating layer may contain nitride containing one or more elements selected from Si, Al, Ti, Nb, Zr, Sn, Ta and W.

Further, in the translucent substrate of the embodiment, the degree of oxidation of the transparent conductive film may be higher at a side near to the glass substrate than at a side far from the glass substrate.

Further, in the translucent substrate of the embodiment, the degree of oxidation of the transparent conductive film continuously or discontinuously may decrease from a side near to the glass substrate to a side far from the glass substrate.

In the translucent substrate of the embodiment, the thickness of the transparent conductive film may be 2 nm to 500 nm.

In the translucent substrate of the embodiment, the transparent conductive film may be configured with at least two layers of films including a first transparent conductive layer at a side near to the glass substrate and a second transparent conductive layer at a side far from the glass substrate, and the degree of oxidation of the first transparent conductive layer may be higher than that of the second transparent conductive layer.

In the translucent substrate of the embodiment, the resistivity of the transparent conductive film may be less than $2.38 \times 10^{-4}$ Ωcm.

In the translucent substrate of the embodiment, an attenuation coefficient of the transparent conductive film may be less than or equal to 0.0086.

Further, according to the invention, there is provided an organic LED element including a glass substrate, a first electrode layer, an organic light emitting layer and a second electrode layer in this order, including the above described translucent substrate.

Further, according to the invention, there is provided a method of manufacturing a translucent substrate including a glass substrate, a coating layer formed on the glass substrate and a transparent conductive film formed on the coating layer, including: a step of preparing a glass substrate containing at least one element selected from a group consisting of Bi, Ti and Sn; a step of depositing a coating layer by a dry depositing method on the glass substrate; and a step of depositing a transparent conductive film on the coating layer.

Further, according to the invention, there is provided a method of manufacturing a translucent substrate including a glass substrate, a scattering layer formed on the glass substrate, a coating layer formed on the scattering layer and a transparent conductive film formed on the coating layer, including: a step of providing a scattering layer including a base material made of glass and a plurality of scattering substances dispersed in the base material, on the glass substrate, the scattering layer containing at least one element selected from a group consisting of Bi, Ti and Sn; a step of depositing a coating layer by a dry depositing method on the scattering layer; and a step of depositing a transparent conductive film on the coating layer.

In the method of manufacturing the translucent substrate of the embodiment, the coating layer may contain oxide containing one or more elements selected from Si, Al, Ti, Nb, Zr, Sn, Ta and W.

In the method of manufacturing the translucent substrate of the embodiment, the coating layer may contain nitrogen oxide containing one or more elements selected from Si, Al, Ti, Nb, Zr, Sn, Ta and W.

In the method of manufacturing the translucent substrate of the embodiment, the coating layer may contain nitride containing one or more elements selected from Si, Al, Ti, Nb, Zr, Sn, Ta and W.

In the method of manufacturing the translucent substrate of the embodiment, in the step of depositing the transparent conductive film, the transparent conductive film may be deposited such that the degree of oxidation is higher at a side near to the glass substrate than at a side far from the glass substrate.

In the method of manufacturing the translucent substrate of the embodiment, in the step of depositing the transparent conductive film, the transparent conductive film may be deposited such that the degree of oxidation continuously or discontinuously decreases from a side near to the glass substrate to a side far from the glass substrate.

In the method of manufacturing the translucent substrate of the embodiment, in the step of depositing the transparent conductive film, the thickness of the transparent conductive film may be 2 nm to 500 nm. In the method of manufacturing the translucent substrate of the embodiment, the step of depositing the transparent conductive film may include (i) a step of depositing a first transparent conductive layer, and thereafter, (ii) a step of depositing a second transparent conductive layer on the first transparent conductive layer, wherein the first transparent conductive layer is deposited such that its degree of oxidation becomes higher than that of the second transparent conductive layer.

In the method of manufacturing the translucent substrate of the embodiment, the resistivity of the transparent conductive film may be less than $2.38 \times 10^{-4}$ Ωcm.

In the method of manufacturing the translucent substrate of the embodiment, an attenuation coefficient of the transparent conductive film may be less than or equal to 0.0086.

According to the invention, a translucent substrate, in which generation of coloring is significantly suppressed and an organic LED element including such a translucent substrate can be provided. Further, according to the invention, a method of manufacturing a translucent substrate in which generation of coloring is significantly suppressed can be provided.

DETAILED DESCRIPTION OF THE PREFERRED EMBODIMENTS

The invention will be described herein with reference to illustrative embodiments.

In this embodiment, although an example is explained in which an ITO film is used as a transparent conductive film, there is a possibility that coloring is generated in a glass substrate or a scattering layer containing Bi or the like when depositing various transparent conductive films other than the ITO film. Thus, in a translucent substrate of the embodiment, it is not limited to the ITO film and various transparent conductive films may be adapted instead of the ITO film. Then, it is preferable that the transparent conductive film satisfies various conditions (parameters) explained by exemplifying the ITO film even when the transparent conductive film is adapted instead of the ITO film. In other words, in the following explanation, an "ITO film", or an "ITO layer" may be read as a "transparent conductive film" or a "transparent conductive layer" as well.

As the transparent conductive film, in addition to the above described ITO film, an $SnO_2$ (tin oxide) film, a GZO (gallium zinc oxide) film, an IZO (indium zinc oxide) film, an AZO (Al doped ZnO) film, a Ta doped $SnO_2$ film, a Ti doped $In_2O_3$ film or the like may be exemplified, for example.

(First Translucent Substrate)

Figure 1:
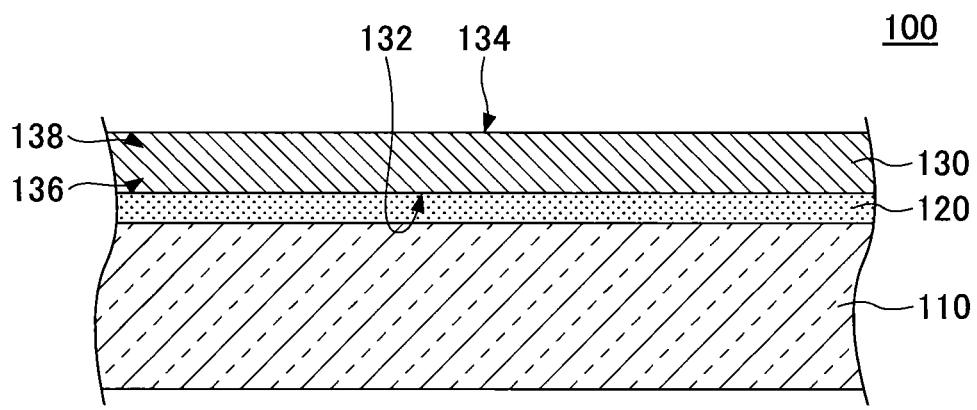
FIG. 1 is a schematic cross-sectional view illustrating a first translucent substrate of an embodiment.

FIG. 1 is a schematic cross-sectional view illustrating a first translucent substrate of the embodiment.

As illustrated in FIG. 1, a first translucent substrate 100 of the embodiment includes a glass substrate 110, a coating layer 120 formed on the glass substrate 110 and an ITO film 130 formed on the coating layer 120.

The glass substrate 110 contains at least one element of bismuth (Bi), titanium (Ti) and tin (Sn).

Then, on the glass substrate 110, in other words, between the glass substrate 110 and the ITO film 130, the coating layer 120 is provided. The coating layer 120 is a film deposited by a dry depositing method.

An advantage of such a coating layer 120 is explained.

According to the studies by the present inventors, it is recognized that coloring is often generated in a glass substrate when forming an ITO film on the glass substrate. Such coloring of the glass substrate greatly affects the characteristics of the translucent substrate, and further on the characteristics of the organic LED element. For example, when using the organic LED element including the glass substrate in which coloring is generated, a problem may occur such as the light generated in the organic light emitting layer is absorbed inside the element and the light extracting efficiency is greatly lowered.

Here, paragraph [0130] of WO 2009/017035 discloses a relationship between transmittance of a scattering layer base material and light extracting efficiency of an organic LED element, and it is indicated that as absorption of the scattering layer increases, the light extracting efficiency of the organic LED is lowered. Thus, according to the translucent substrate of the embodiment, the light extracting efficiency of the organic LED element can be improved by suppressing coloring of the glass substrate or the scattering layer, which will be explained later, and suppressing absorption by the glass substrate or the scattering layer.

Such coloring of the glass substrate tends to occur when a specific component is included in the glass substrate, more specifically, when at least one element among bismuth (Bi), titanium (Ti) and tin (Sn) (hereinafter, these elements are referred to as a "reducible element") is included in the glass substrate.

On the other hand, generally, when depositing an ITO film, an atmosphere in which the concentration of oxygen is relatively low is used. This is because if the ITO film is deposited under an "excessive oxygen" atmosphere, the electrical conductivity of the obtained ITO film is lowered and it is difficult for the ITO film to be used as an electrode of the element.

From the consideration based on these facts, it is considered that coloring of the glass substrate is caused by a phenomenon that an environment in which the glass substrate is exposed when depositing the ITO film on the glass substrate comes to have an oxygen absence.

In other words, a reducible element in the glass substrate is reduced because the vicinity of the glass substrate becomes a weak oxidizing atmosphere when depositing the ITO film, and with this, the glass substrate is colored.

Based on the above consideration, according to the invention, the coating layer 120 deposited by a dry depositing method is provided on a surface of the glass substrate 110 that faces the ITO film 130.

A film deposited by a wet depositing method includes micro pores in the film because solvent (dispersion media) is evaporated in a drying step or the like. On the other hand, as solvent (dispersion media) is not evaporated for a film deposited by a dry depositing method, the film deposited by a dry depositing method can be a dense film.

Then, by providing the coating layer 120, which is such a dense film, on a surface of the glass substrate 110 that faces the ITO film 130, it is possible to suppress a reduction reaction of the reducible element contained in the glass substrate 110 due to the atmosphere when depositing the ITO film 130. It is considered that this is because the coating layer 120 functions as a barrier layer.

As such, by providing the coating layer 120 deposited by a dry depositing method, a probability can be reduced that the reducible element contained in the glass substrate 110 contacts the weak oxidizing atmosphere, which is the atmosphere when depositing the ITO film 130. Thus, generation of coloring in the glass substrate 110 can be significantly suppressed. Further, the coating layer 120 functions as an anti-etching barrier that prevents elution, degeneration or the like of the glass substrate 110 when patterning the ITO film 130, for example.

Here, the dry depositing method for forming the coating layer 120 is not specifically limited, but a sputtering method, a plasma CVD method or the like may be exemplified, for example. When forming the coating layer 120 by a sputtering method, as an atmosphere for depositing it, the coating layer 120 can be deposited under an atmosphere including argon and/or oxygen. In particular, from a view point of productivity, it is preferable to deposit under an atmosphere including argon. Here, in this case, as argon in the atmosphere is mixed in the deposited coating layer 120, the obtained coating layer 120 may be a film containing argon.

As the problem that coloring is generated in the glass substrate or the like is a specific problem for depositing the ITO film, oxygen concentration in the atmosphere when depositing the coating layer 120 is not a specific problem. However, in order to surely prevent generation of coloring in the glass substrate 110 even when depositing the coating layer 120, it is preferable that the coating layer 120 is deposited under an atmosphere including oxygen. For example, it is preferable that the oxygen concentration of the atmosphere when depositing the coating layer 120 is greater than or equal to 10 vol %, and more preferably, greater than or equal to 15 vol %. The upper limit value of the oxygen concentration is not specifically limited, and may be selected based on the material or the like of the depositing coating layer or the like. For example, it is preferable that the oxygen concentration is less than or equal to 90 vol %, and more preferably, less than or equal to 80 vol %.

Further, for the coating layer 120, as described above, as long as it is deposited by a dry depositing method, its material or structure is not specifically limited. Further, it is not necessary for the coating layer 120 to be configured by a single material and the coating layer 120 may include a plurality of materials. Further, the coating layer 120 may be configured by a plurality of layers. For example, the coating layer 120 may include oxide containing one or more elements selected from Si, Al, Ti, Nb, Zr, Sn, Ta and W. Further, the coating layer 120 may include nitrogen oxide containing one or more elements selected from Si, Al, Ti, Nb, Zr, Sn, Ta and W. Further, the coating layer 120 may include nitride containing one or more elements selected from Si, Al, Ti, Nb, Zr, Sn, Ta and W.

Further, it is preferable that the filling ratio of the coating layer 120 is greater than or equal to 85%, and more preferably, greater than or equal to 90%, for example. At this time, the upper limit value is not specifically limited, and may be less than or equal to 100%, for example. It is preferable that the filling ratio of the coating layer 120 is within the above range, in particular, because reduction reaction of the reducible element contained in the glass substrate 110 due to the atmosphere when depositing the ITO film 130 can be suppressed.

Here, the filling ratio can be calculated by dividing a measured density by a theoretical density calculated from the composition of the coating layer, and multiplying it by 100. For example, the filling ratio can be calculated by dividing a measured density of a film measured using an X-ray reflectometer, for example, by a theoretical density calculated from the composition of the film, and multiplying the obtained value by 100. In measuring the density of the coating film, if the density varies in the thickness direction, the highest density in the film may be used as the measured density of the coating film.

Further, it is preferable that the surface roughness (arithmetic mean roughness) Ra of the surface of the coating layer 120 on which the ITO film 130 is stacked is less than or equal to 2.0 nm, and more preferably, less than or equal to 1.0 nm. The lower limit value is not specifically limited, and may be greater than or equal to 0 nm, for example.

It is preferable that the surface roughness Ra is within the above range because it indicates that the surface of the coating layer 120 on which the ITO film 130 is stacked is smooth, and a crystal nucleus of ITO grows appropriately.

Further, it is preferable that the refraction index of the coating layer 120 is close to the refraction index of the glass substrate 110. This is because when a difference between the refraction index of the glass substrate 110 and the refraction index of the coating layer 120 is large, there is a case that variation occurs in luminescent color of the organic LED by an influence of an interference due to unevenness of the thickness of the coating layer 120. On the other hand, when the refraction index of the glass substrate 110 and the refraction index of the coating layer 120 are close to each other, the luminescent color of the organic LED does not vary because an interference condition does not change even if there is unevenness of the thickness of the coating layer 120. It is preferable that the different between the refraction index of the glass substrate 110 and the refraction index of the coating layer 120, to the light whose wavelength is 550 nm, is greater than or equal to minus 0.15 and less than or equal to plus 0.15, more preferably, greater than or equal to minus 0.1 and less than or equal to plus 0.1, and furthermore preferably, greater than or equal to minus 0.05 and less than or equal to plus 0.05.

It is preferable that the coating layer has a property hardly eroded by etchant (mixed solution of 50 at % of hydrochloric acid and 50 at % of ferric chloride, for example) of the ITO film. This is because if the coating layer is eroded when patterning the ITO, the base material of the scattering layer and the glass substrate may be eroded by the etchant, and cannot be used as elements. Thus, a material such as zinc oxide or the like that is easily soluble in acidic solution is not suitable for the coating layer.

ITO film 130 functions as one of electrodes (anode) when a completed product, an organic LED element, for example, is structured from the first translucent substrate 100.

The ITO film 130 includes a first surface 132 that is at a side near to the glass substrate 110, and a second surface 134 that is at a side far from the glass substrate 110.

In this embodiment, the structure of the ITO film 130 is not specifically limited, and as described above, the ITO film 130 may be deposited under an atmosphere in which oxygen content is relatively low in order to obtain a predetermined electrical conductivity, for example. This is because coloring of the glass substrate can be suppressed regardless of the depositing condition of the ITO film 130 as the coating layer 120 is provided for the first translucent substrate of the embodiment.

As described above, the ITO film 130 may be deposited in the atmosphere in which oxygen content is relatively low, and the depositing condition is not varied when depositing the ITO film 130 to form the ITO film 130 having a substantially uniform composition. Further, in particular, it is preferable that the ITO film 130 is formed such that the degree of oxidation (extent of oxidation) is higher at the first surface 132 side than that at the second surface 134 side. In this case, the electrical conductivity at the second surface 134 side becomes higher than that at the first surface 132 side.

Here, an effect is explained under a status that the degree of oxidation (extent of oxidation) is higher at the first surface 132 side than the second surface 134 side of the ITO film 130.

As described above, generally, when depositing the ITO film, the atmosphere in which oxygen content is relatively low is used, and conventionally it is considered that coloring of the glass substrate is generated due to such an atmosphere. For this problem, in the first translucent substrate of the embodiment, coloring of the glass substrate is suppressed by providing the predetermined coating layer 120.

Then, as described above, when the ITO film 130 is formed such that the degree of oxidation (extent of oxidation) at the first surface 132 side is higher than that at the second surface 134 side, when depositing the ITO film, the depositing atmosphere is set to be an "excessive oxygen" condition compared with before at an initial stage. With this, when depositing the ITO film 130, the atmosphere near the glass substrate becomes a strong oxidizing atmosphere, and reduction of the reducible element in the glass substrate can be particularly suppressed. As a result, with the function of the coating layer 120, coloring of the glass substrate can be further suppressed.

However, if the entirety of the ITO film is deposited by such an "excessive oxygen" condition, then, the resistivity of the ITO film becomes high, as described above, and the ITO film cannot be used as the electrode.

Thus, after forming an ITO film portion whose "degree of oxidation is high" (hereinafter, referred to as a "first ITO portion" 136) by deposition under an initial "excessive oxygen" condition, it is preferable that the depositing condition is changed to a normal condition, for example, and then an ITO film portion whose "degree of oxidation is low" (hereinafter, referred to as a "second ITO portion" 138) is formed to configure the entirety of the ITO film.

When forming the ITO film 130 by the above described method, in addition to the coating layer 120, the first ITO portion 136 functions as a barrier layer for reduction reaction of the reducible element included in the glass substrate 110 when depositing the second ITO portion 138. Thus, even when the second ITO portion 138 is deposited under the conventional oxygen absence environment, reduction of the reducible element in the glass substrate 110 can be particularly suppressed. As a result, coloring of the glass substrate 110 can be further significantly suppressed.

Further, in this case, as the electrical conductivity of the second ITO portion 138 is higher than that of the first ITO portion 136, increasing of the electrical conductivity of the ITO film 130 as a whole can be suppressed.

Thus, compared with a case in which the ITO film 130 is deposited without changing the depositing condition, coloring of the glass substrate 110 can be further suppressed and increasing of the resistivity of the ITO film 130 can be suppressed.

As described above, when the ITO film 130 includes the first ITO portion 136 whose degree of oxidation is high and the second ITO portion 138 whose degree of oxidation is low, the embodiment of variation of the degree of oxidation from the first ITO portion 136 to the second ITO portion 138 is not particularly limited.

For example, the degree of oxidation of the ITO film 130 may be continuously varied from the first surface 132 to the second surface 134, may be discontinuously varied (stepwise, for example), or may be varied by the embodiment combining the continuous portion and the discontinuous portion. Further, when the degree of oxidation is continuously varied, the variation may be linear or curved. Alternatively, a third ITO portion whose degree of oxidation is the lowest may be provided between the first ITO portion 136 and the second ITO portion 138.

Furthermore, expressions of the first ITO portion 136 and the second ITO portion 138 are just used for explanation and those may not be necessarily clearly identified.

Here, it should be noted that the "degree of oxidation" or the "extent of oxidation" of the ITO film used in the above described explanation is an index relatively used for expressing the difference between two comparative objects.

The "degree of oxidation" of the ITO film 130 may be relatively evaluated by performing an X-ray Photoelectron Spectroscopy (XPS) analysis on each of two comparative objects, respectively, for example.

The resistivity of the ITO film 130 is not specifically limited, and may be less than $2.38 \times 10^{-4}$ Ωcm, for example.

Here, the resistivity of the ITO film 130 means resistivity of the entirety of the ITO film 130. Thus, for a structure in which the ITO film is deposited without varying a depositing condition and the composition is substantially uniform, or for a structure in which the degrees of oxidation in the ITO film are different (not uniform), it is preferable that the resistivity of the ITO film 130 is within the above range, and the structure of the film is not limited.

Further, the thickness of the ITO film 130 is not specifically limited, is selectable in accordance with supplied electric power, has transferring speed of the base material or the like, and may have a thickness of 2 nm to 520 nm, more preferably, a thickness of 2 nm to 500 nm.

Further, it is preferable that an attenuation coefficient of the ITO film is less than or equal to 0.0086. The attenuation coefficient can be evaluated by an ellipsometry method, for example, and its value changes with the atmosphere when depositing the ITO film. Then, the fact that the attenuation coefficient of the ITO film is within the above range means that the ITO film was deposited under an atmosphere in which the amount of oxygen is sufficiently low when depositing at least a part of the ITO film. Thus, when the attenuation coefficient of the ITO film satisfies the above rule, that means hole resistivity of the ITO film is sufficiently low. Here, the attenuation coefficient indicates a value obtained by measuring the entirety of the ITO film either for the cases when the ITO film is a single layer or when the ITO film is configured by a plurality of layers. Here, in this specification, the attenuation coefficient is defined as that at wavelength of 550 nm.

Here, as described above, the ITO film may be various transparent conductive films. When the transparent conductive film is used instead of the ITO film, it is preferable that the transparent conductive film satisfies the same conditions as those of the ITO film. As the transparent conductive film is previously explained, explanations are not repeated.

(Second Translucent Substrate)

Next, a second translucent substrate of the embodiment is explained.

Figure 2:
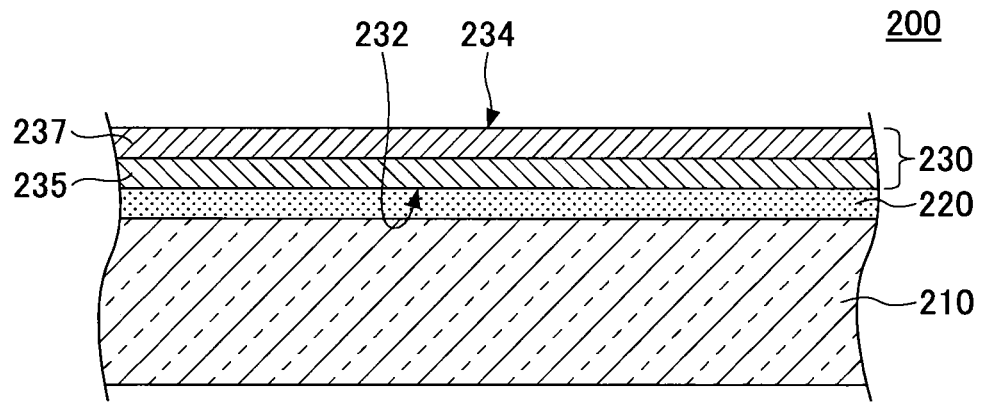
FIG. 2 is a schematic cross-sectional view illustrating a second translucent substrate of the embodiment.

FIG. 2 is a schematic cross-sectional view illustrating the second translucent substrate of the embodiment.

As illustrated in FIG. 2, a second translucent substrate 200 is basically configured similarly to the first translucent substrate 100. Thus, in FIG. 2, the same components as those illustrated in FIG. 1 are given reference numerals obtained by adding 100 to the reference numerals in FIG. 1.

However, in the second translucent substrate 200 illustrated in FIG. 2, the structure of the ITO film 230 is different from that of the ITO film 130 illustrated in FIG. 1. In other words, the ITO film 230 including a first surface 232 and a second surface 234 has a multi-layered structure including at least two layers. For example, in FIG. 2, the ITO film 230 includes a first ITO layer 235 provided at a side near to the glass substrate 210 and a second ITO layer 237 provided at a side far from the glass substrate 210.

Then, in this case, the structure of each of the first ITO layer 235 and the second ITO layer 237 is not specifically limited. For example, the degrees of oxidation of the first ITO layer 235 and the second ITO layer 237 may be the same, or the degree of oxidation of one of the ITO layers is higher than the other of the ITO layers.

However, it is preferable that the degree of oxidation of the first ITO layer 235 is higher than that of the second ITO layer 237. In this case, the electrical conductivity of the second ITO layer 237 becomes higher than that of the first ITO layer 235.

As such, when the degree of oxidation of the first ITO layer 235 is higher than that of the second ITO layer 237, the second ITO layer 237 is deposited under a lower oxidizing atmosphere than that for the first ITO layer 235.

However, in addition to the coating layer 220, the first ITO layer 235 functions as a barrier layer for suppressing reduction reaction of the reducible element contained in the glass substrate 210 due to the atmosphere when depositing the second ITO layer 237. Thus, it is preferable because coloring of the glass substrate 210 can be further suppressed. Further, by providing the second ITO layer 237 whose degree of oxidation is high, an effect of suppressing increasing of the resistivity of the ITO film 230 can be obtained.

Here, although the ITO film 230 is a two-layered structure in the example of FIG. 2, the ITO film 230 may be composed by three or more layers. In this case, it is preferable that the ITO film provided at the nearest side of the glass substrate is configured such that its degree of oxidation is higher than that of each of other ITO films.

The first ITO layer 235 may have a thickness of 1 nm to 20 nm, for example. Similarly, the second ITO layer 237 may have a thickness of 1 nm to 500 nm, for example. The total thickness of the ITO film 230 may be within a range of 2 nm to 520 nm, for example, and preferably, between 2 nm to 500 nm.

Further, the total resistivity of the ITO film 230 may be less than $2.38 \times 10^{-4}$ Ωcm, for example. Here, the resistivity of the ITO film 230 means resistivity of the entirety of the ITO film 230.

Further, it is preferable that the attenuation coefficient of the ITO film is less than or equal to 0.0086. As the attenuation coefficient is explained for the first translucent substrate, explanations are not repeated here.

As described above, the ITO film may be various transparent conductive films. When the transparent conductive film is used instead of the ITO film, it is preferable that the transparent conductive film satisfies the same conditions as those of the ITO film. Further, in the second translucent substrate, the first ITO layer 235 and the second ITO layer 237 may be the first transparent conductive layer and the second transparent conductive layer, respectively. The first transparent conductive layer and the second transparent conductive layer may have different compositions.

As the transparent conductive film is previously explained, explanations are not repeated.

(Third Translucent Substrate)

The structure and the effect of the invention is explained by exemplifying the translucent substrate configured by the glass substrate, the ITO film and the coating layer. However, the present invention is not limited to such an embodiment.

For example, recently, it has been proposed that a scattering layer for scattering light is provided at a surface of the glass substrate on which an ITO film is provided in order to increase the light extracting efficiency from the translucent substrate and the organic LED element.

Here, such a scattering layer is configured by a glass base material and scattering substances dispersed in the base material, for example. Thus, even when the glass scattering layer contains the "reducible element", the problem as described above may occur, in which coloring of the scattering layer occurs when depositing an ITO film on the scattering layer.

Thus, another translucent substrate of the invention is explained for significantly suppressing the problem of coloring of the scattering layer.

Figure 3:
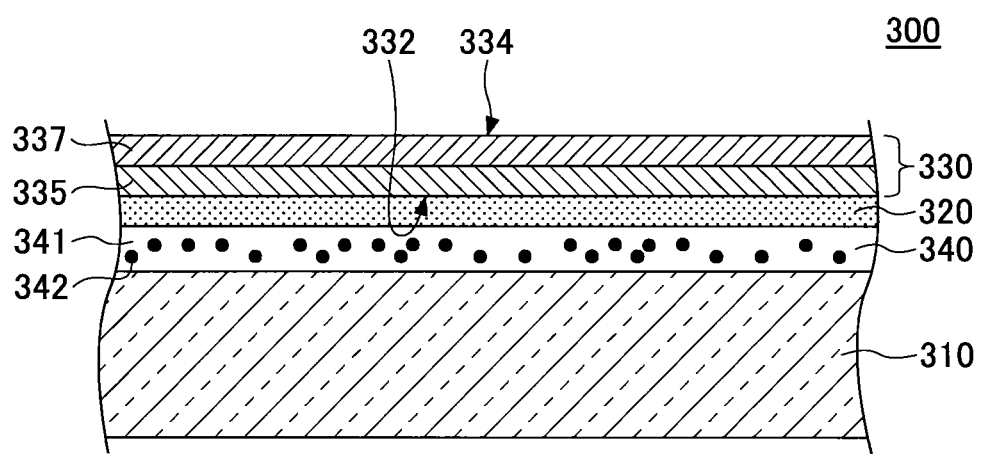
FIG. 3 is a schematic cross-sectional view illustrating a third translucent substrate of the embodiment.

FIG. 3 is a schematic cross-sectional view illustrating a third translucent substrate 300 of the embodiment.

As illustrated in FIG. 3, the third translucent substrate 300 includes a glass substrate 310, a scattering layer 340, a coating layer 320 and an ITO film 330.

In this embodiment, different from the above described glass substrate 110 or 210, the glass substrate 310 does not necessarily contain the above described reducible element. Thus, in the third translucent substrate, the glass substrate 310 may contain at least one element of bismuth (Bi), titanium (Ti) and tin (Sn), in other words, the "reducible element", or may not include it.

The scattering layer 340 is configured by a glass base material 341 having a first refraction index and a plurality of scattering substances 342 each having a second refraction index different from the base material 341 dispersed in the base material 341. The scattering layer 340 includes at least one element among bismuth (Bi), titanium (Ti) and tin (Sn), in other words, a "reducible element". Here, the scattering layer 340 contains the reducible element means that at least either of the base material 341 and the scattering substances 342 composing the scattering layer 340 includes the reducible element.

Then, the coating layer 320 deposited by a dry depositing method is provided between the scattering layer 340 and the ITO film 330. As the coating layer 320 is deposited by a dry depositing method, it is a dense film.

Here, the dry depositing method for forming the coating layer 320 is not specifically limited, but a sputtering method, a plasma CVD method or the like may be exemplified, for example. When forming the coating layer 320 by a sputtering method, as an atmosphere for depositing it, the coating layer 320 can be deposited under an atmosphere including argon and/or oxygen. In particular, from a view point of productivity, it is preferable to deposit under an atmosphere including argon. Here, in this case, as argon in the atmosphere is mixed in the deposited coating layer 320, the obtained coating layer 320 may be a film containing argon.

As the problem that coloring is generated in the glass substrate or the like is a specific problem for depositing the ITO film, oxygen concentration in the atmosphere when depositing the coating layer 320 is not a specific problem. However, in order to surely suppress generation of coloring in the scattering layer 340 even when depositing the coating layer 320, it is preferable that the coating layer 320 is deposited under an atmosphere including oxygen. For example, it is preferable that the oxygen concentration of the atmosphere when depositing the coating layer 320 is greater than or equal to 10 vol %, and more preferably, greater than or equal to 15 vol %. The upper limit value of the oxygen concentration is not specifically limited, and may be selected based on the material or the like of the depositing coating layer. For example, it is preferable that the oxygen concentration is less than or equal to 90 vol %, and more preferably, less than or equal to 80 vol %.

Further, for the coating layer 320, as described above, as long as it is deposited by a dry depositing method, its material or structure is not specifically limited. Further, it is not necessary for the coating layer 320 to be configured by a single material and the coating layer 320 may include a plurality of materials. Further, the coating layer 320 may be configured by a plurality of layers. For example, the coating layer 320 may include oxide containing one or more elements selected from Si, Al, Ti, Nb, Zr, Sn, Ta and W. Further, the coating layer 320 may include nitrogen oxide containing one or more elements selected from Si, Al, Ti, Nb, Zr, Sn, Ta and W. Further, the coating layer 320 may include nitride containing one or more elements selected from Si, Al, Ti, Nb, Zr, Sn, Ta and W.

Further, it is preferable that the filling ratio of the coating layer 320 is greater than or equal to 85%, and more preferably, greater than or equal to 90%, for example. At this time, the upper limit value is not specifically limited, and may be less than or equal to 100%, for example. It is preferable that the filling ratio of the coating layer 320 is within the above range, in particular, because reduction reaction of the reducible element contained in the scattering layer 340 due to the atmosphere when depositing the ITO film 330 can be suppressed.

Here, as the method of calculating the filling ratio is already explained above, explanations are not repeated.

Further, it is preferable that the surface roughness (arithmetic mean roughness) Ra of the surface of the coating film 320 on which the ITO film 330 is stacked is less than or equal to 2.0 nm, and more preferably, less than or equal to 1.0 nm. The lower limit value is not specifically limited, and may be greater than or equal to 0 nm, for example.

It is preferable that the surface roughness Ra is within the above range because it indicates that the surface of the coating layer 320 on which the ITO film 330 is stacked is smooth, and crystal nucleus of ITO grows appropriately.

Further, it is preferable that the refraction index of the coating layer 320 is close to the refraction index of the base material 341. This is because when a difference between the refraction index of the base material 341 and the refraction index of the coating layer 320 is large, there is a case that variation occurs in luminescent color of the organic LED by an influence of an interference due to unevenness of the thickness of the coating layer 320. On the other hand, when the refraction index of the base material 341 and the refraction index of the coating layer 320 are close to each other, the luminescent color of the organic LED does not vary because an interference condition does not change even if there is unevenness of the thickness of the coating layer 320. It is preferable that the difference between the refraction index of the base material 341 and the refraction index of the coating layer 320, to the light whose wavelength is 550 nm, is greater than or equal to minus 0.15 and less than or equal to plus 0.15, more preferably, greater than or equal to minus 0.1 and less than or equal to plus 0.1, and furthermore preferably, greater than or equal to minus 0.5 and less than or equal to plus 0.5.

By providing the coating layer 320, which is a dense film, at a surface of the scattering layer 340 facing the ITO film 330, reduction reaction of the reducible element contained in the scattering layer 340 due to the atmosphere when depositing the ITO film 330 can be suppressed. It is considered that this is because the coating layer 320 functions as a barrier layer.

As such, by providing the coating layer 320 deposited by a dry depositing method, a probability that a weak oxidizing atmosphere when depositing the ITO film 330 contacts the reducible element contained in the scattering layer 340 can be reduced. Thus, it is possible to significantly suppress generation of coloring of the scattering layer 340. Further, the coating layer 320 functions as an anti-etching barrier that prevents elution, degeneration or the like of the scattering layer 340 when performing a patterning process of the ITO film 330 as well, for example.

The ITO film 330 functions as one of the electrodes (anode) when a completed product, an organic LED element, for example, is configured with the third translucent substrate 300. The ITO film 330 includes a first surface 332 provided at a side near to the glass substrate 310 and a second surface 334 provided at a side far from the glass substrate 310.

The structure of the ITO film 330 is not specifically limited, and may be various embodiments as explained for the first and second translucent substrates. Here, although an example is illustrated in FIG. 3 in which the ITO film 330 is composed by two layers, this is not limited so. As will be explained later, the ITO film 330 may be configured by a single layer or two or more layers.

For example, the ITO film 330 may be configured by a single layer of the ITO film whose composition is substantially uniform that is deposited without varying the depositing condition in a depositing step.

Further, as another embodiment of a case in which the ITO film is configured by a single layer, as explained above for the first translucent substrate, the ITO film 330 may be formed such that the degree of oxidation (extent of oxidation) is higher at the first surface 332 side than the second surface 334 side. In this case, the electrical conductivity at the second surface 334 becomes higher than that at the first surface 332 side.

By configuring the ITO film 330 as such, when depositing the ITO film, the depositing atmosphere is set to be an "excessive oxygen" condition compared with before at an initial stage. With this, when depositing the ITO film 330, the atmosphere near the scattering layer becomes a strong oxidizing atmosphere, and reduction of the reducible element in the scattering layer can be particularly suppressed. As a result, in addition to the function of the coating layer 320, coloring of the scattering layer can be further suppressed.

Then, after forming an ITO film portion (first ITO portion) whose "degree of oxidation is high" by deposition under an initial "excessive oxygen" condition, it is preferable that the depositing condition may be changed to a normal condition, and an ITO film portion (second ITO portion) whose "degree of oxidation is low" is formed to configure the entirety of the ITO film.

When forming the ITO film 330 by such a method, as explained for the first translucent substrate, in addition to the coating layer 320, the first ITO portion functions as a barrier layer for the reduction reaction of the reducible element contained in the scattering layer 340 when depositing a second ITO portion. Thus, even when the second ITO portion is deposited in an oxygen absence environment, reducing of the reducible element in the scattering layer 340 can be specifically suppressed. As a result, coloring of the scattering layer 340 can be significantly suppressed.

Further, in this case, as the electrical conductivity of the second ITO portion is higher than that of the first ITO portion, increasing of the resistivity of the entirety of the ITO film 330 can be suppressed.

Thus, compared with a case in which the ITO film 330 is deposited without varying the depositing condition, coloring of the glass substrate 310 can be further suppressed and increasing of the resistivity of the ITO film 330 can be suppressed.

As described above, when the ITO film 330 includes the first ITO portion whose degree of oxidation is high and the second ITO portion whose degree of oxidation is low, the embodiment of variation of the degree of oxidation from the first ITO portion to the second ITO portion is not particularly limited.

For example, the degree of oxidation of the ITO film 330 may be continuously varied from the first surface 332 to the second surface 334, may be discontinuously varied (stepwise, for example), or may be varied by the embodiment combining the continuous portion and the discontinuous portion. Further, when the degree of oxidation is continuously varied, the variation may be linear or curved. Alternatively, a third ITO portion whose degree of oxidation is the lowest may be provided between the first ITO portion and the second ITO portion. Furthermore, as explained for the first translucent substrate, expressions of the first ITO portion and the second ITO portion are just used for explanation and those may not be necessarily clearly identified.

Further, the ITO film 330 may have a structure including a multi-layered structure. For example, as illustrated in FIG. 3, the ITO film 330 may be configured with at least two layers, and may include two layers, a first ITO layer 335 at a side near to the glass substrate 310 and a second ITO layer 337 at a side far from the glass substrate.

In this case, similarly as the ITO film 230 of the translucent substrate 200 illustrated in FIG. 2, it is preferable that the degree of oxidation is higher in the first ITO layer 335 than in the second ITO layer 337. In this case, the electrical conductivity at the second ITO layer 337 becomes higher than the first ITO layer 335.

When configuring as such, the first ITO layer 335 is formed under an "excessive oxygen" atmosphere compared with before, and thus, reduction of the reducible element in the scattering layer 340 during depositing the first ITO layer 335 can be significantly suppressed.

Then, the second ITO layer 337 is deposited under an atmosphere with less oxygen, similarly as the conventional weak oxidizing atmosphere, for example, compared with the depositing condition of the first ITO layer 335. In this case, because of the existence of the coating layer 320 and the first ITO layer 335, in other words, as the coating layer 320 and the first ITO layer 335 function as barrier layers, reduction reaction of the reducible element contained in the scattering layer 340 can be suppressed when depositing the second ITO layer 337.

As a result, the ITO film 330 that includes the first ITO layer 335 whose degree of oxidation is higher than that of the second ITO layer 337 and the second ITO layer 337 whose electrical conductivity is higher than that of the first ITO layer 335 can be formed without causing generating coloring in the scattering layer 340.

The first ITO layer 335 may have a thickness of 1 nm to 20 nm, for example. Similarly, the second ITO layer 337 may have a thickness of 1 nm to 500 nm, for example. It is preferable that the total thickness of the ITO film 330 is within a range of 2 nm to 520 nm, and more preferably, 2 nm to 500 nm for example.

Further, the total resistivity of the ITO film 330 may be less than $2.38 \times 10^{-4}$ Ωcm, for example.

Here, the resistivity of the ITO film 330 means resistivity of the entirety of the ITO film 330. At this time, the structure of the ITO film 330 is not specifically limited. Thus, as described above, the ITO film 330 may have a structure whose composition is substantially uniform that is deposited without varying the depositing condition. Further, as described above, the ITO film 330 may have a structure in which the degrees of oxidation in the ITO film are different (not uniform) such as including the first ITO portion 336 whose degree of oxidation is high and the second ITO portion 338 whose degree of oxidation is low. Further, the ITO film 330 may be configured by a plurality of layers.

Further, it is preferable that the attenuation coefficient of the ITO film is less than or equal to 0.0086. As the attenuation coefficient is explained for the first translucent substrate, explanations are not repeated here.

From the above description, in the third translucent substrate 300 as well, by providing the coating layer 320 deposited by a dry depositing method, both effects of preventing coloring of the scattering layer 340 and suppressing of increasing of resistivity of the ITO film 330 can be obtained.

Here, as described above, the ITO film may be various transparent conductive films. When the transparent conductive film is used instead of the ITO film, it is preferable that the transparent conductive film satisfies the condition same as that for the ITO film. As the transparent conductive film is already explained, explanations are not repeated.

(Organic LED Element)

Figure 4:
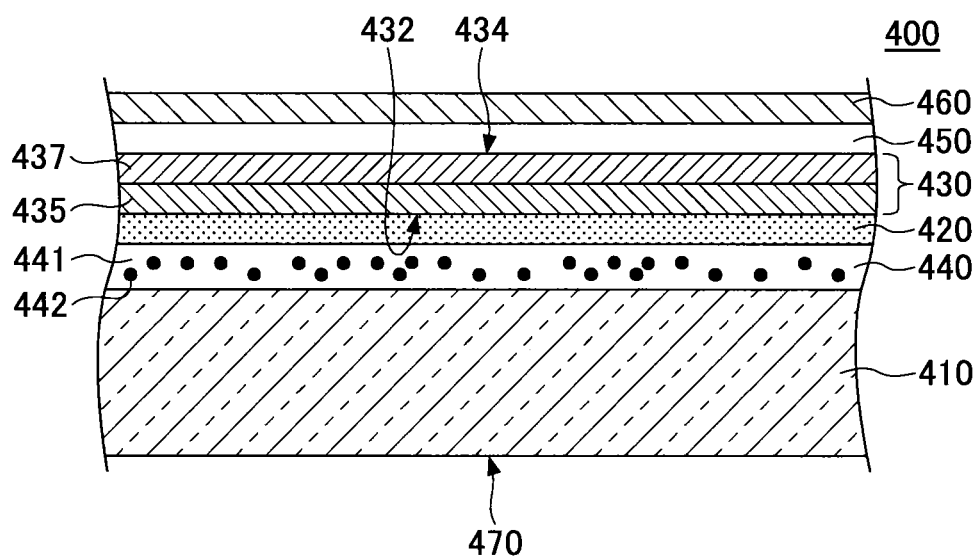
FIG. 4 is a schematic cross-sectional view illustrating an organic LED element of the embodiment.

Next, with reference to FIG. 4, an organic LED element of the embodiment is explained.

FIG. 4 is a schematic cross-sectional view illustrating an example of the organic LED element of the embodiment.

As illustrated in FIG. 4, an organic LED element 400 of the embodiment is configured by stacking a glass substrate 410, a scattering layer 440, a coating layer 420, a first electrode (anode) layer 430, an organic light emitting layer 450 and a second electrode (cathode) layer 460 in this order.

The glass substrate 410 has a function to support at its upper portion each layer composing the organic LED element. In the example illustrated in FIG. 4, a lower side surface of the organic LED element 400 (in other words, an exposed surface of the glass substrate 410) becomes a light extraction surface 470.

The scattering layer 440 may include a glass base material 441 having a first refraction index and a plurality of scattering substances 442 each having a second refraction index different from the base material 441 dispersed in the base material 441.

The scattering layer 440 has a function to effectively scatter light generated from the organic light emitting layer 450 and reduce the amount of light that is totally reflected in the organic LED element 400. Thus, for the organic LED element 400 having the structure as illustrated in FIG. 4, the amount of light output from the light extraction surface 470 can be improved.

The scattering layer 440 includes the above described "reducible element".

The coating layer 420 deposited by a dry depositing method is provided between the scattering layer 440 and the first electrode 430.

The structure of the coating layer 420 may be the same as that explained for the first to third translucent substrates. As specific examples of the structure are already explained, the explanations are not repeated.

By providing the coating layer 420, reduction reaction of the reducible element contained in the scattering layer 440 due to the atmosphere when depositing the ITO film 430 can be suppressed. It can be considered that this is because the coating layer 420 functions as a barrier layer.

As such, by providing the coating layer 420 deposited by the dry depositing method, the probability that the weak oxidizing atmosphere which is an atmosphere when depositing the ITO film 430 contacts the reducible element contained in the scattering layer 440 can be decreased. Thus, generation of coloring of the scattering layer 440 can be significantly suppressed. Further, the coating layer 420 may function as a smoothing layer that soothes the surface of the scattering layer and facilitates the depositing process of the following layers. Further, the coating layer 420 may function as an anti-etching barrier that prevents elution, degeneration or the like of the scattering layer 440 when patterning the first electrode layer (ITO film) 430, for example.

The first electrode layer 430 may be configured by an ITO film. Further, as described above, the first electrode layer 430 may be configured by various transparent conductive films. On the other hand, the second electrode layer 460 may be configured by metal such as aluminum or silver, for example.

Generally, the organic light emitting layer 450 may be configured by a plurality of layers such as an electron transport layer, an electron injection layer, a hole transport layer, a hole injection layer or the like in addition to a light emitting layer.

Here, the ITO film configuring the first electrode layer 430 may be various embodiments explained for the first to third translucent substrates. The ITO film configured by two layers, the first ITO layer 435 at a side near to the glass substrate 410 and the second ITO layer 437 at a side far from the glass substrate 410, is exemplified in FIG. 4, but is not limited so. For example, the ITO film may be configured by a single layer or may have a multi-layered structure. As other structures of the ITO film are already explained in the first to third translucent substrates, explanations are not repeated.

As described above, for the organic LED element 400 including the first electrode layer 430 configured as such, as the coating layer 420 is provided, coloring can be further surely prevented for the scattering layer 440. Further, increasing of the resistivity of the first electrode layer 430 can be suppressed.

Here, although a structure of FIG. 4 is exemplified as the structure of the organic LED element, it is not limited to such an embodiment. The structures of the glass substrate 410, the scattering layer 440, the coating layer 420 and the first electrode layer 430 in FIG. 4 are the same as those of each of the first to third translucent substrates as already explained above.

Further, although an example of the structure in which the organic LED element 400 includes the scattering layer 440 in FIG. 4, the scattering layer 440 is not always necessary for the organic LED element, and may be omitted. However, for such an organic LED element that does not include the scattering layer, as explained for the first translucent substrate and the second translucent substrate, the glass substrate has a composition including the reducible element.

(Each Element)

Next, each element composing the organic LED element 400 is explained in detail. Here, it should be noted that a part of the elements explained below may be similarly usable in each of the translucent substrates 100 to 300 illustrated in FIG. 1 to FIG. 3, respectively.

(Glass Substrate 410)

The glass substrate 410 is made of a material having high transmittance of visible light. For the material of the glass substrate 410, an inorganic glass such as alkali glass, non-alkali glass (alkali-free glass), quartz glass or the like may be exemplified.

When the organic LED element does not include the scattering layer 440, the glass substrate 410 includes the reducible element.

The thickness of the glass substrate 410 is not specifically limited, but may be within a range of 0.1 mm to 2.0 mm, for example. When considering the strength and the weight, it is preferable that the thickness of the glass substrate 410 is 0.5 mm to 1.4 mm.

(Scattering Layer 440)

The scattering layer 440 includes a base material 441 and a plurality of scattering substances 442 dispersed in the base material 441. The base material 441 has a first refraction index and the scattering substances 442 include a second refraction index that is different from the base material.

The scattering layer 440 includes the reducible element.

The amount of the scattering substances 442 in the scattering layer 440 preferably becomes smaller from the inside of the scattering layer 440 to the outside of the scattering layer 440, and at this time, light extracting efficiency can be increased.

The base material 441 is made of glass. For the material of the glass, an inorganic glass such as soda-lime glass, borosilicate glass, non-alkali glass (alkali-free glass), quartz glass or the like may be used.

The scattering substances 442 may be made of, for example, pores of a material (bubbles), precipitated crystals, particles of a material different from the base material, phase separated glass or the like. Phase separated glass means a glass composed of two or more kinds of glass phases.

It is preferable that the difference between the refraction index of the base material 441 and the refraction index of the scattering substances 442 is large. For this reason, it is preferable that a high refraction index glass is used for the base material 441 and pores of a material are used for the scattering substances 442.

For the high refraction index glass used for the base material 441, one or more components may be selected from $P_2O_5$, $SiO_2$, $B_2O_3$, $GeO_2$ and $TeO_2$ as a network former and one or more components may be selected from $TiO_2$, $Nb_2O_5$, $WO_3$, $Bi_2O_3$, $La_2O_3$, $Gd_2O_3$, $Y_2O_3$, $ZrO_2$, $ZnO$, $BaO$, $PbO$ and $Sb_2O_3$ as a high refraction index component. Further in order to adjust characteristics of the glass, an alkali oxide, an alkaline earth oxide, a fluoride or the like may be added within a range not impairing characteristics for the refraction index.

Thus, for the glass based material composing the base material 441, for example, a $B_2O_3$—$ZnO$—$La_2O_3$ system, a $P_2O_5$—$B_2O_3$—$R'_2O$—$R''O$—$TiO_2$—$Nb_2O_5$—$WO_3$—$Bi_2O_3$ system, a $TeO_2$—$ZnO$ system, a $B_2O_3$—$Bi_2O_3$ system, a $SiO_2$—$Bi_2O_3$ system, a $SiO_2$—$ZnO$ system, a $B_2O_3$—$ZnO$ system, a $P_2O_5$—$ZnO$ system or the like is exemplified. Here, R' represents an alkali metal element and R" represents an alkaline earth metal element. The above material systems are examples and the materials to be used are not limited as long as satisfying the above-mentioned conditions.

By adding a colorant in the base material 441, color of light emission can be changed. For the colorant, a transition metal oxide, a rare earth metal oxide, a metal colloid or the like may be used singly or in combination thereof.

(Coating Layer 420)

The coating layer 420 is provided between the scattering layer 440 and the first electrode layer 430. If the scattering layer 440 is not provided, the coating layer 420 may be formed on the glass substrate 410.

The coating layer 420 is a film deposited by a dry depositing method. The film deposited by a dry depositing method may be a dense film compared with a film deposited by a wet depositing method. Thus, even under the weak oxidizing atmosphere when depositing the ITO film, a probability that the atmosphere contacts the glass substrate or the scattering layer can be reduced and generation of coloring of the glass substrate or the scattering layer can be significantly suppressed. Further, as it is unnecessary to prepare an oxygen rich atmosphere when depositing the ITO film, increasing of the resistivity of the ITO film (first electrode film) can be suppressed as well.

As described above, the coating layer 420 may be a film deposited by a dry depositing method, and the dry depositing method for forming the coating layer 420 is not specifically limited, but a sputtering method or a plasma CVD method may be exemplified, for example. When forming the coating layer 420 by a sputtering method, as an atmosphere for depositing it, the coating layer 420 can be deposited under an atmosphere including argon and/or oxygen. In particular, from a view point of productivity, it is preferable to deposit under an atmosphere including argon. In this case, as argon in the atmosphere is mixed in the deposited coating layer 420, the obtained coating layer 420 may be a film containing argon.

As the problem that coloring is generated in the glass substrate or the like is a specific problem for depositing the ITO film, oxygen concentration in an atmosphere when depositing the coating layer 420 is not a specific problem. However, in order to surely prevent generation of coloring in the glass substrate 410 even when depositing the coating layer 420, it is preferable that the coating layer 420 is deposited under an atmosphere including oxygen. For example, it is preferable that the oxygen concentration of the atmosphere when depositing the coating layer 420 is greater than or equal to 10 vol %, and more preferably, greater than or equal to 15 vol %. The upper limit value of the oxygen concentration is not specifically limited, and may be selected based on the material or the like of the depositing coating layer. For example, it is preferable that the oxygen concentration is less than or equal to 90 vol %, and more preferably, less than or equal to 80 vol %.

Further, for the coating layer 420, as described above, as long as it is deposited by a dry depositing method, its material or structure is not specifically limited. Further, it is not necessary for the coating layer 420 to be configured by a single material and the coating layer 420 may include a plurality of materials. Further, the coating layer 420 may be configured by a plurality of layers. For example, the coating layer 420 may include oxide containing one or more elements selected from Si, Al, Ti, Nb, Zr, Sn, Ta and W. Further, the coating layer 420 may include nitrogen oxide containing one or more elements selected from Si, Al, Ti, Nb, Zr, Sn, Ta and W. Further, the coating layer 420 may include nitride containing one or more elements selected from Si, Al, Ti, Nb, Zr, Sn, Ta and W.

Further, it is preferable that the filling ratio of the coating layer 420 is greater than or equal to 85%, and more preferably, greater than or equal to 90%. At this time, the upper limit value is not specifically limited, but may be less than or equal to 100%, for example. It is preferable that the filling ratio of the coating layer 420 is within the above range, in particular, because the reduction reaction of the reducible element contained in the scattering layer or the glass substrate due to the atmosphere when depositing the ITO film 430 can be suppressed.

As the method of calculating the filling ratio is already explained, explanations are not repeated.

Further, for a surface of the coating layer 420 on which the ITO film 430 is stacked, it is preferable that the surface roughness (arithmetic mean roughness) Ra is less than or equal to 2.0 nm, and more preferably, less than or equal to 1.0 nm. Here, the lower limit value is not specifically limited, and may be greater than or equal to 0 nm, for example.

It is preferable that the surface roughness Ra is within the above range because it means that a surface of the ITO film 430 on which the coating layer 420 is stacked is smooth, and a crystal nucleus of the ITO grow appropriately.

It is preferable that the refraction index of the coating layer 420 is close to the refraction index of the base material 441. This is because when a difference between the refraction index of the base material 441 and the refraction index of the coating layer 420 is large, there is a case that variation occurs in luminescent color of the organic LED by an influence of an interference due to unevenness of the thickness of the coating layer 420. On the other hand, when the refraction index of the base material 441 and the refraction index of the coating layer 420 are close to each other, the luminescent color of the organic LED does not vary because an interference condition does not change even if there is unevenness of the thickness of the coating layer 420. It is preferable that the difference between the refraction index of the base material 441 and the refraction index of the coating layer 420, to the light whose wavelength is 550 nm, is greater than or equal to minus 0.15 and less than or equal to plus 0.15, more preferably, greater than or equal to minus 0.1 and less than or equal to plus 0.1, and furthermore preferably, greater than or equal to minus 0.05 and less than or equal to plus 0.05, for example.

Further, in order to improve the extracting efficiency, it is preferable that the refraction index of the coating layer 420 is higher than that of the first electrode layer 430. However, as described above, it is preferable that the difference between the refraction index of the coating layer 420 and the refraction index of the base material 441 is small.

The thickness of the coating layer 420 is not specifically limited. The thickness of the coating layer 420 may be within a range of 50 nm to 500 μm, for example.

(First Electrode Layer 430)

As described above, the first electrode layer 430 is configured by the ITO film. As described above, the ITO film may be configured by a single layer or may have a multi-layered structure of two or more layers.

For example, as illustrated in FIG. 4, the ITO film may be configured by two layers, a first ITO layer 435 at a side near to the glass substrate 410 and a second ITO layer 437 at a side far from the glass substrate 410. In this case, it is preferable that the first ITO layer 435 is configured such that its degree of oxidation is higher than that of the second ITO layer 437. When configuring as such, the electrical conductivity of the second ITO layer 437 becomes higher than that of the first ITO layer 435.

The thickness of the first ITO layer 435 is not specifically limited, but preferably, within a range of 1 nm to 20 nm, for example. The thickness of the second ITO layer 437 is not specifically limited, but preferably, within a range of 1 nm to 500 nm, for example. It is preferable that the total thickness of the ITO film is within a range of 2 nm to 520 nm, and more preferably, 2 nm to 500 nm, for example.

Here, the ITO film that configures the first electrode layer 430 may be composed of three or more layers. Alternatively, as illustrated in FIG. 1, the ITO film may be composed of a single layer. In this case, in particular, it is preferable that the degree of oxidation varies (decreases) continuously or discontinuously from the first surface 432 to the second surface 434 of the first electrode layer 430.

It is preferable that the total thickness of the first electrode layer 430 is greater than or equal to 50 nm.

It is preferable that the refraction index of the first electrode layer 430 is within a range of 1.65 to 2.2. Here, it is preferable that the refraction index of the first electrode layer 430 is determined by considering the refraction index of the base material 441 composing the scattering layer 440 or the reflectance of the second electrode layer 460. When considering a calculation of waveguide, a reflectance of the second electrode layer 460 or the like, it is preferable that the difference between the refraction indexes of the first electrode layer 430 and the base material 441 is less than or equal to 0.2.

Here, as described above, the first electrode layer 430 may be configured by various transparent conductive films instead the ITO film. It is preferable that the transparent conductive film satisfies various conditions (parameters) explained by exemplifying the ITO film even when the transparent conductive film is adapted instead of the ITO film. Further, as the transparent conductive film is already explained, explanations are not repeated.

(Organic Light Emitting Layer 450)

The organic light emitting layer 450 has a function to emit light, and generally, includes a hole injection layer, a hole transport layer, a light emitting layer, an electron transport layer and an electron injection layer. Here, as long as the organic light emitting layer 450 includes the light emitting layer, it is not necessary to include all of the other layers. Generally, it is preferable that the refraction index of the organic light emitting layer 150 is within a range of 1.7 to 1.8.

It is preferable for the hole injection layer to have a small difference in ionization potential in order to lower a hole injection barrier from the first electrode layer 430. When the injection efficiency of electric charges from the electrode to the hole injection layer is increased, the drive voltage of the organic EL element 400 is lowered so that the injection efficiency of the electric charges is increased.

For the material of the hole injection layer, a high molecular material or a low molecular material is used. Among the high molecular materials, polyethylenedioxythiophene (PEDOT: PSS) doped with polystyrene sulfonic acid (PSS) is often used. Among the low molecular materials, copper phthalocyanine (CuPc) of a phthalocyanine system is widely used.

The hole transport layer has a function to transfer the holes injected by the hole injection layer to the light emitting layer. For the hole transport layer, a triphenylamine derivative, N,N'-Bis(1-naphthyl)-N,N'-Diphenyl-1,1'-biphenyl-4,4'-diamine (NPD), N,N'-Diphenyl-N,N'-Bis[N-phenyl-N-(2-naphtyl)-4'-aminobiphenyl-4-yl]-1,1'-biphenyl-4,4'-diamine (NPTE), 1,1'-bis[(di-4-tolylamino)phenyl] cyclohexane (HTM2), and N,N'-Diphenyl-N,N'-Bis(3-methylphenyl)-1,1'-diphenyl-4,4'-diamine (TPD) or the like may be used, for example.

The thickness of the hole transport layer may be within a range of 10 nm to 150 nm, for example. The thinner the layer, the lower the voltage of the organic EL element can be. However, it is preferable that the thickness is within a range of 10 nm to 150 nm in view of an interelectrode short circuit problem.

The light emitting layer has a function to provide a field at which the injected electrons and the holes are recombined. For the organic luminescent material, a low molecular material or a high molecular material may be used, for example.

The light emitting layer may be, for example, a metal complex of quinoline derivative such as tris(8-quinolinolate) aluminum complex ($Alq_3$), bis(8-hydroxy) quinaldine aluminum phenoxide (Alq'2OPh), bis(8-hydroxy) quinaldine aluminum-2,5-dimethylphenoxide (BAlq), mono(2,2,6,6-tetramethyl-3,5-heptanedionate)lithium complex (Liq), mono (8-quinolinolate)sodium complex (Naq), mono(2,2,6,6-tetramethyl-3,5-heptanedionate) lithium complex, mono(2,2,6,6-tetramethyl-3,5-heptanedionate) sodium complex, bis (8-quinolinolate) calcium complex ($Caq_2$) and the like, or a fluorescent substance such as tetraphenylbutadiene, phenylquinacridone (QD), anthracene, perylene, coronene and the like.

As for the host material, a quinolinolate complex may be used, especially, an aluminum complex having 8-quinolinol or a derivative thereof as a ligand may be used.

The electron transport layer has a function to transport electrons injected from the electrode. For the electron transport layer, for example, a quinolinol aluminum complex ($Alq_3$), an oxadiazole derivative (for example, 2,5-bis(1-naphthyl)-1,3,4-oxadiazole (END), 2-(4-t-butylphenyl)-5-(4-biphenyl)-1,3,4-oxadiazole (PBD) or the like), a triazole derivative, a bathophenanthroline derivative, a silole derivative or the like may be used.

The electron injection layer may be, for example, made by providing a layer in which alkali metal such as lithium (Li), cesium (Cs) or the like is doped at an interface with the second electrode layer 460.

(Second Electrode Layer 460)

For the second electrode layer 460, for example, a metal with a small work function or the alloy thereof may be used, for example. For the second electrode layer 460, for example, an alkali metal, an alkaline earth metal, metals in group 3 of the periodic table and the like are preferably used. For the second electrode layer 460, for example, aluminum (Al), magnesium (Mg), an alloy of these metals and the like may be preferably used.

Further, a co-vapor-deposited film of aluminum (Al) and magnesium silver (MgAg) or a laminated electrode in which aluminum (Al) is vapor-deposited on a thin layer of lithium fluoride (LiF) or lithium oxide ($Li_2O$) may be used. Further, a laminated layer of calcium (Ca) or barium (Ba) and aluminum (Al) may be used.

(Method of Manufacturing Translucent Substrate of Embodiment of Invention)

Next, with reference to the drawings, an example of a method of manufacturing a translucent substrate of an embodiment of the invention is explained. Here, the method of manufacturing the translucent substrate is explained by exemplifying the structure of the translucent substrate 300 illustrated in FIG. 3 as an example. However, a part of the following explanations can be adapted similarly to the translucent substrates 100 and 200 illustrated in FIG. 1 and FIG. 2. Thus, the structures are the same as those explained for the first to third translucent substrates otherwise explained below.

Figure 5:
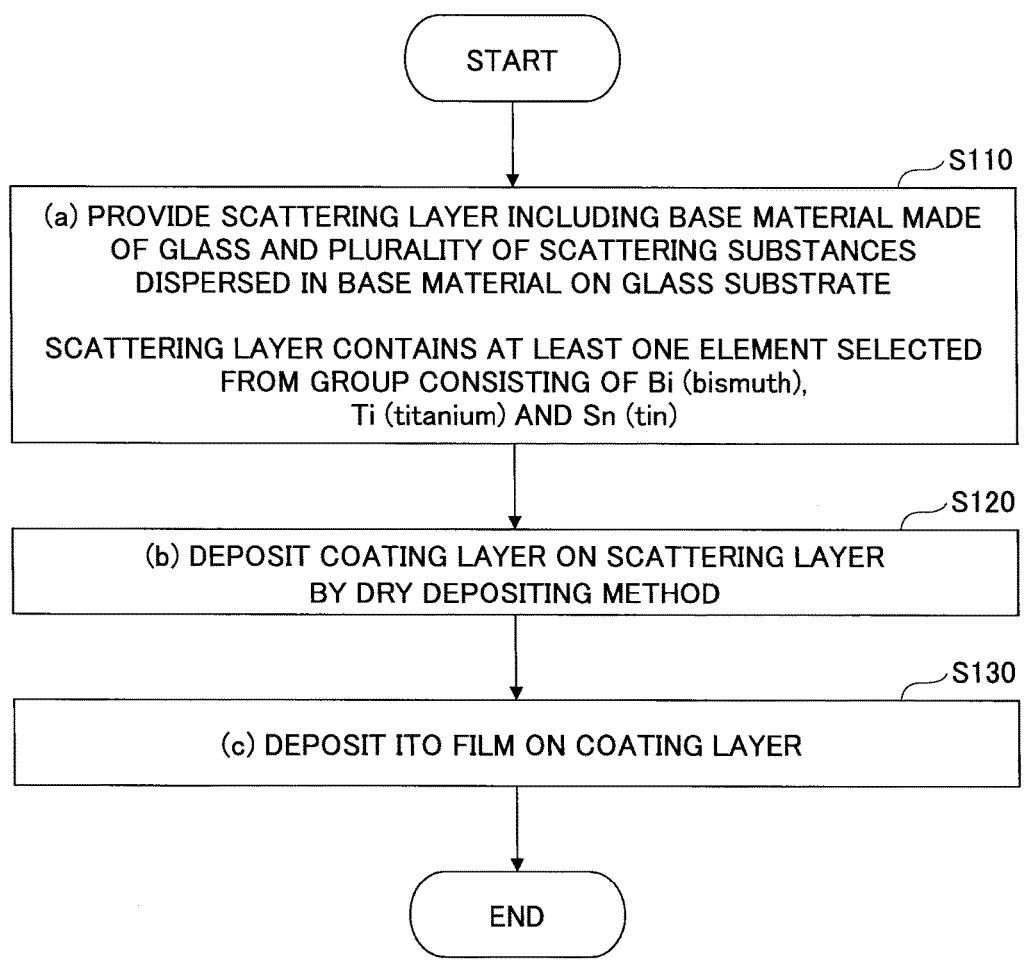
FIG. 5 is a flowchart schematically illustrating an example of a method of manufacturing the organic LED element of the embodiment.

FIG. 5 is a schematic flowchart illustrating a method of manufacturing the translucent substrate of the embodiment.

As illustrated in FIG. 5, the method of manufacturing the translucent substrate includes (a) a step of providing a scattering layer including a base material made of glass and plurality of scattering substances dispersed in the base material on a glass substrate, the scattering layer containing at least one element selected from a group consisting of Bi (bismuth), Ti (titanium) and Sn (tin) (step S110), (b) a step of depositing the coating layer on the scattering layer by a dry depositing method (step S120), and (c) a step of depositing the ITO film on the coating layer (step S130).

Hereinafter, each step is explained in detail. Further, in the following, reference numerals illustrated in FIG. 3 are used as reference numerals of each member for clarification.

(Step S110)

First, the glass substrate 310 is prepared. Next, the scattering layer 340 containing the reducible element is formed on the glass substrate 310.

The method of forming the scattering layer 340 is not particularly limited, but the method of forming the scattering layer 340 by a "frit paste method" is specifically explained in this embodiment. However, the scattering layer 340 may be formed by other methods.

In the frit paste method, a paste including a glass material, called a frit paste, is prepared (preparing step), the frit paste is coated at a surface of a substrate to be mounted and patterned (patterning step), and the frit paste is sintered or baked (Sintering step). With these steps, a desired glass film is formed on the substrate to be mounted. Each of the steps is explained in the following.

(Preparing Step)

First, the frit paste including glass powders, resin, solvent and the like is prepared.

The glass powder is made of a material finally forming the base material 341 of the scattering layer 340. The composition of the glass powder is not particularly limited as long as desired scattering characteristics can be obtained while being capable of being in a form of the frit paste and sintered. Here, according to the invention, the scattering layer includes the reducible element.

The composition of the glass powder may be, for example, including 20 mol % to 30 mol % of $P_2O_5$, 3 mol % to 14 mol % of $B_2O_3$, 10 mol % to 20 mol % of $Bi_2O_3$, 3 mol % to 15 mol % of $TiO_2$, 10 mol % to 20 mol % of $Nb_2O_5$, 5 mol % to 15 mol % of $WO_3$ where the total amount of $Li_2O$, $Na_2O$ and $K_2O$ is 10 to 20 mol %, and the total amount of the above components is more than or equal to 90 mol %. Further, the composition of the glass powder may be, including 0 to 30 mol % of $SiO_2$, 10 to 60 mol % of $B_2O_3$, 0 to 40 mol % of ZnO, 0 to 40 mol % of $Bi_2O_3$, 0 to 40 mol % of $P_2O_5$, 0 to 20 mol % of alkali metal oxide where the total amount of the above components is more than or equal to 90 mol %. The grain diameter of the glass powder may be for example, within a range of 1 μm to 100 μm.

In order to control a thermal expansion characteristic of a finally obtained scattering layer, a predetermined amount of fillers may be added to the glass powder. As for the filler, for example, particles such as zircon, silica, alumina or the like may be used, and, generally, the grain diameter may be within a range of 0.1 μm to 20 μm.

For the resin, for example, ethyl cellulose, nitrocellulose, acrylic resin, vinyl acetate, butyral resin, melamine resin, alkyd resin, rosin resin or the like may be used. By adding butyral resin, melamine resin, alkyd resin, or rosin resin, the strength of the frit paste coating layer is improved.

The solvent has a function to dissolve resin and adjust the viscosity. The solvent may be, for example, an ether type solvent (butyl carbitol (BC), butyl carbitol acetate (BCA), dipropylene glycol butyl ether, tripropylene glycol butyl ether, butyl cellosolve acetate), an alcohol type solvent (α-terpineol, pine oil), an ester type solvent (2,2,4-trimethyl-1,3-pentanediol monoisobutyrate), a phthalic acid ester type solvent (dibutyl phthalate (DBP), dimethyl phthalate (DMP), dioctyl phthalate (DOP)) or the like. The solvent mainly used is α-terpineol or 2,2,4-trimethyl-1,3-pentanediol monoisobutyrate. Further, dibutyl phthalate (DBP), dimethyl phthalate (DMP) and dioctyl phthalate (DOP) also function as a plasticizer.

Further, for the frit paste, a surfactant may be added for viscosity adjustment and frit dispersion promotion. Further, a silane coupling agent may be used for surface modification.

The frit paste in which the glass materials are uniformly dispersed is prepared by mixing these materials.

(Patterning Step)

Next, the frit paste prepared by the above described method is coated on the glass substrate 310 to be patterned. The method of coating and patterning is not particularly limited. For example, the frit paste may be pattern printed on the glass substrate 310 using a screen printer. Alternatively, doctor blade printing or die coat printing may be used.

Thereafter, the frit paste film is dried.

(Sintering Step)

Next, the frit paste film is sintered (or baked). Generally, sintering is performed by two steps. In the first step, the resin in the frit paste film is decomposed and made to disappear, and in the second step, the glass powders are softened and sintered.

The first step is performed under the atmosphere by retaining the frit paste film within a temperature range of 200° C. to 400° C. Note that the process temperature is varied in accordance with the material of the resin included in the frit paste. For example, when the resin is ethyl cellulose, the process temperature may be about 350° C. to 400° C. and when the resin is nitrocellulose, the process temperature may be about 200° C. to 300° C. The process period is generally about 30 minutes to 1 hour.

The second step is performed under the atmosphere by retaining the frit paste film within a temperature range of softening temperature of the glass powders included in the frit paste layer ±30° C. The process temperature is within a range of 450° C. to 600° C., for example. Further, the process period is not specifically limited, and is 30 minutes to 1 hour, for example.

The base material 341 of the scattering layer 340 is formed after the second step as the glass powders are softened and sintered. Further, by the scattering substances, for example by pores, included in the frit paste film, the scattering substances 342 uniformly dispersed in the base material 341 can be obtained.

Thereafter, the scattering layer 340 can be formed by cooling the glass substrate 310. The thickness of the finally obtained scattering layer 340 may be within a range of 5 μm to 50 μm, for example.

Here, when manufacturing the translucent substrate without the scattering layer as illustrated in FIG. 1 or FIG. 2, this step may be a step (S110') of preparing a glass substrate containing at least one element selected from a group consisting of (a') Bi (bismuth), Ti (titanium) and Sn (tin).

(Step S120)

Next, the coating layer 320 is deposited on the scattering layer 340.

The coating layer 320 is deposited by a dry depositing method. The dry depositing method for forming the coating layer 320 is not particularly limited, but a sputtering method or a plasma CVD method may be used, for example. When forming the coating layer 320 by a sputtering method, as an atmosphere for depositing it, the coating layer 120 can be deposited under an atmosphere including argon and/or oxygen. In particular, from a view point of productivity, it is preferable to deposit under an atmosphere including argon. In this case, as argon in the atmosphere is mixed into the deposited coating layer 320, the obtained coating layer 320 may be a film containing argon.

As the problem that coloring is generated in the glass substrate or the like is a specific problem for depositing the ITO film, oxygen concentration in an atmosphere when depositing the coating layer 320 is not a specific problem. However, in order to surely prevent generation of coloring in the scattering layer 340 or the glass substrate 310 even when depositing the coating layer 320, it is preferable that the coating layer 320 is deposited under an atmosphere including oxygen. For example, it is preferable that the oxygen concentration of the atmosphere when depositing the coating layer 320 is greater than or equal to 2 vol %, and more preferably, greater than or equal to 10 vol %. The upper limit value of the oxygen concentration is not specifically limited, and may be selected based on the material or the like of the depositing coating layer. For example, it is preferable that the oxygen concentration is less than or equal to 90 vol %, and more preferably, less than or equal to 80 vol %.

Further, for the coating layer 320, as described above, as long as it is deposited by a dry depositing method, its material or structure is not specifically limited. Further, it is not necessary for the coating layer 320 to be configured with a single material and the coating layer 320 may include a plurality of materials. Further, the coating layer 320 may be configured with a plurality of layers. For example, the coating layer 320 may include oxide containing one or more elements selected from Si, Al, Ti, Nb, Zr, Sn, Ta and W. Further, For example, the coating layer 320 may include nitrogen oxide containing one or more elements selected from Si, Al, Ti, Nb, Zr, Sn, Ta and W. Further, the coating layer 320 may include nitride containing one or more elements selected from Si, Al, Ti, Nb, Zr, Sn, Ta and W.

Further, it is preferable that the filling ratio of the coating layer 320 is greater than or equal to 85%, and more preferably, greater than or equal to 90%, for example. At this time, the upper limit value is not specifically limited, and may be less than or equal to 100%, for example. It is preferable that the filling ratio of the coating layer 320 is within the above range, in particular, because the reduction reaction of the reducible element included in the scattering layer or the glass substrate due to the atmosphere when depositing the ITO film 330 can be suppressed.

Here, as the method of calculating the filling ratio is already explained, explanations are not repeated.

Further, it is preferable that the surface roughness (arithmetic mean roughness) Ra at a surface of the coating film 320 on which the ITO film 330 is stacked is less than or equal to 2.0 nm, and more preferably, less than or equal to 1.0 nm. Furthermore, the lower limit value is not specifically limited, and may be greater than or equal to 0 nm, for example.

It is preferable that the surface roughness Ra is within the above range because it means that a surface of the coating layer 320 on which the ITO film 330 is stacked is smooth, and a crystal nucleus of the ITO grows appropriately.

Further, it is preferable that the refraction index of the coating layer 320 is close to the refraction index of the base material 341. This is because if the difference between the refraction index of the base material 341 and the refraction index of the coating layer 320 is large, luminescent color of the organic LED is varied by an influence of the interference due to the thickness variation of the coating layer 320. On the other hand, when the refraction index of the base material 341 and the refraction index of the coating layer 320 are close to each other, the luminescent color of the organic LED does not vary because an interference condition does not change even if there is unevenness of the thickness of the coating layer 320. It is preferable that the difference between the refraction index of the base material 341 and the refraction index of the coating layer 320, to the light whose wavelength is 550 nm, is greater than or equal to minus 0.15 and less than or equal to plus 0.15, more preferably, greater than or equal to minus 0.1 and less than or equal to plus 0.1, and further more preferably, greater than or equal to minus 0.05 and less than or equal to plus 0.05.

Here, when manufacturing the translucent substrate without a scattering layer, it is preferable that the refraction index of the coating layer is close to the refraction index of the glass substrate. As this case is already explained for the first translucent substrate, explanations are not repeated.

Further, in order to further improve extracting efficiency, it is preferable that the refraction index of the coating layer 320 is higher than that of the ITO film 330. However, as described above, it is preferable that a difference between the refraction index of the coating layer 320 and the refraction index of the scattering layer 340 is as small as possible.

The thickness of the coating layer 320 is not specifically limited. The thickness of the coating layer 320 may be within a range of 50 nm to 500 μm, for example.

Here, when manufacturing the translucent substrate which does not include the scattering layer as illustrated in FIG. 1 or FIG. 2, this step may be (b') a step of depositing a coating layer by a dry depositing method on the glass substrate (S120'). The depositing method of the coating layer may be the same as that explained above.

(Step S130)

Next, the ITO film 330 is deposited on the coating layer 320.

The providing method of the ITO film 330 is not specifically limited, and the ITO film 330 may be provided by a depositing method such as a sputtering method, an evaporation method, a vapor deposition method or the like, for example.

Hereinafter, as an example, a method in which the ITO film 330 is formed by a sputtering method is explained. Although an example is explained in which the ITO film 330 includes the first ITO layer 335 and the second ITO layer 337 here, as described above, the ITO film may be configured by a single layer. As the ITO film configured by a single layer is already explained for the first translucent substrate, explanations are not repeated.

When forming the ITO film 330 by the sputtering method, the ITO film 330 may be deposited by a first depositing step for depositing the first ITO layer 335 and a second depositing step for depositing the second ITO layer 337, for example.

(i First Depositing Step)

Generally, when depositing the ITO film by the sputtering method, a target composed of an alloy of metal indium and metal tin or an ITO target is used.

Although the power density of the plasma varies in accordance with a scale of an apparatus, it is preferable that the power density of the plasma is within a range of 0.2 W/cm$^2$ to 5 W/cm$^2$, for example.

Further, mixed gas of inert gas and oxygen may be used as sputtering gas.

According to the method of manufacturing of the embodiment, it is preferable that the first ITO layer 335 is deposited under a stronger oxidizing atmosphere than a conventional one, in other words, under the "excessive oxygen" condition, in the first depositing step.

Here, an oxidizing ability of a deposition environment is defined by a ratio R (vol %·cm$^2$/W) of oxygen partial pressure $P_{O2}$ (vol %) of sputtering gas with respect to plasma power density $P_d$ (W/cm$^2$), in other words, using R=$P_{O2}/P_d$, by the following reason.

In other words, for example, the amount of oxygen included in the sputtering gas varies by various depositing conditions such as a scale or a kind of a sputtering apparatus, power of plasma and the like. Thus, it is difficult to express the oxidizing ability of the deposition environment by just oxygen partial pressure in the sputtering gas. However, when using the index R (vol %·cm$^2$/W) (R=$P_{O2}/P_d$), the influence of variation factors as described above is normalized and the oxidizing ability of the deposition environment can be more appropriately compared.

Here, by the above definition, it can be said that the larger the index R (vol %·cm$^2$/W) is, the more oxidizing the environment is, and the more "excessive oxygen" condition is. As described above, when the first ITO layer 335 is deposited under an excessive oxygen condition, it is preferable that the index R (vol %·cm$^2$/W) is greater than or equal to 1.03 (vol %·cm$^2$/W) and more preferably, greater than or equal to 1.5 (vol %·cm$^2$/W). The index R (vol %·cm$^2$/W) may be greater than or equal to about 1.6, or greater than or equal to about 2, for example.

By depositing the first ITO layer 335 under such an "excessive oxygen" condition, reduction of the reducible element in the scattering layer 340 during the sputtering process can be significantly suppressed. Further, by performing a sputtering deposition under the "excessive oxygen" condition, the first ITO layer 335 whose degree of oxidation is high can be deposited on the scattering layer 340.

(ii Second Depositing Step)

Next, the second ITO layer 337 is deposited on the first ITO layer 335.

The second ITO layer 337 is deposited under an environment whose oxidizing ability condition is lower than that of the deposition environment selected in the first depositing step, in other words, under an environment whose index R (vol %·cm$^2$/W) is smaller than the index R (vol %·cm$^2$/W) in the first depositing step. For example, the second ITO layer 337 may be deposited under a condition that is generally adopted in a conventional deposition of an ITO film.

In the second depositing step, it is preferable that the index R (vol %·cm$^2$/W) is less than or equal to 1.03.

Here, when depositing the second ITO layer 337, the coating layer 320 and the first ITO layer 335 whose degree of oxidation is higher are already formed on the scattering layer 340. Thus, by the barrier effect of the coating layer 320 and the first ITO layer 335, reducing of the reducible element contained in the scattering layer 340 can be suppressed when depositing the second ITO layer 337.

Thus, in the second depositing step as well, the second ITO layer 337 can be deposited without generating coloring of the scattering layer 340.

The ITO film 330 including the first ITO layer 335 and the second ITO layer 337 can be formed after performing the above described first depositing step and the second depositing step.

Here, as the second ITO layer 337 is deposited under a condition whose index R is smaller (in other words, lower oxidizing ability condition), the electrical conductivity of the film can be increased compared with that for the first ITO layer 335. Thus, compared with a case when the entirety of the ITO film 330 is configured by the first ITO layer 335 whose degree of oxidation is high, the resistivity of the ITO film 330 can be decreased.

For example, the total resistivity of the ITO film 330 can be about $1.5 \times 10^{-4}$ Ωcm, for example, which is as good as that of the ITO film which is deposited by the conventional method.

As such, the ITO film 330 can be formed that includes the first ITO layer 335 whose degree of oxidation is higher than that of the second ITO layer 337 and the second ITO layer 337 whose electrical conductivity is higher than that of the first ITO layer 335.

Thereafter, the ITO film 330 may be patterned by an etching process or the like.

In step S130, a step of depositing various transparent conductive films may be used instead of the ITO film. The transparent conductive film may be deposited similarly as the ITO film. As the transparent conductive electrical conductivity film is already explained above, explanations are not repeated.

By the above steps, the translucent substrate 300 including the glass substrate 310, the scattering layer 340, the coating layer 320 and the ITO film 330 can be manufactured.

Here, when manufacturing an organic LED element from the translucent substrate 300, an organic light emitting layer and a second electrode layer may be further formed in this order.

For example, an organic light emitting layer (the organic light emitting layer 450 illustrated in FIG. 4, for example) may be provided on the ITO film 330 by an evaporation method, a coating method and/or the like. Further, for example, a second electrode layer (the second electrode layer 460 illustrated in FIG. 4, for example) may be provided on the organic light emitting layer by an evaporation method, a sputtering method, a vapor deposition method or the like.

Here, in the above description, the method of manufacturing of the embodiment is explained by exemplifying a case in which the ITO film 330 has a multi-layered structure including the two ITO layers 335 and 337 which are clearly identified. Such the ITO film 330 having the multi-layered structure can be easily formed when suspending the deposition process once before changing the depositing condition such as plasma density, oxygen partial pressure or the like, for example.

However, in the translucent substrate of the embodiment, by providing the coating layer, regardless of the depositing condition for depositing the ITO film, reduction of the reducible element contained in the glass substrate and the scattering layer can be suppressed. Thus, the method of manufacturing of the invention is not limited to the above described embodiments, and the ITO film 130 of a single layer structure including two portions 136 and 138 as illustrated in FIG. 1 may be deposited by a sputtering method, for example. The ITO film 130 of such a single layer structure may be configured by continuously performing deposition or the like, without suspending the deposition process when changing the depositing condition, for example. Further, without changing the depositing condition, a single layered ITO film may be deposited by a depositing condition (weak oxidizing atmosphere) for a normal ITO film, for example, under a condition in which the index R is less than or equal to 1.03.

Further, although an example in which the ITO film 330 is deposited by the sputtering method is given in the above description, this is just an example and the ITO film 330 may be formed by other depositing methods.

A problem and an idea to solve the problem of the invention are explained by exemplifying a translucent substrate and an organic LED element in each of which an ITO film is provided on a glass substrate.

However, the adaptable range of the present invention is not limited to such a translucent substrate and an organic LED element.

For example, as described above, for the translucent substrate electrode layer, various electrical conductivity oxides other than the ITO film may be used such as GZO (gallium zinc oxide), IZO (Indium Zinc Oxide), AZO (Al doped ZnO), $SnO_2$, Ta doped $SnO_2$, Ti doped $In_2O_3$ or the like, for example. Such an electrical conductivity oxide is deposited on the glass substrate under an environment similar to the case when generally depositing the ITO film, in which oxygen absence is easily generated. Thus, even when depositing the various electrical conductivity oxides other than the ITO film, the same problem, coloring of the glass substrate, can occur similarly. By adapting the present invention, such a problem can also be solved.

EXAMPLES

Next, examples of the invention are explained. Examples 1, 2 and 5 to 8 are working examples and Examples 3 and 4 are comparative examples.

A coating layer and an ITO film were deposited on a scattering layer of a glass substrate including the scattering layer containing Bi, and characteristics of obtained samples were evaluated by the following methods.

Example 1

A sample of a translucent substrate was manufactured (hereinafter referred to as "sample 1") by the following methods.

A glass substrate including a scattering layer at its one surface was prepared. At this time, for the scattering layer, a glass containing Bi as a base material was used.

Then, the coating layer was deposited on the scattering layer.

The coating layer was deposited by reactive sputtering.

The deposition was performed by heating the glass substrate including the scattering layer to 250° C., using a 28 at % Si-72 at % Sn target, using argon and oxygen as reaction gas at sputtering, wherein the oxygen concentration was 80 vol %, and by a sputtering apparatus. An STO film (a mixed film containing Si, Sn and O as composition) of 190 nm was deposited as the coating layer.

After depositing the coating layer, the refraction index, the surface roughness Ra and the filling ratio of the coating layer were measured by the methods explained below. For Examples 2 to 8, the measurements were similarly performed after depositing the coating layer.

Next, the ITO film was deposited on the coating layer.

The ITO film was deposited by reactive sputtering similarly as the coating layer.

The deposition was performed by heating the substrate on which the structures up to the coating layer were formed to 380° C., using an ITO target, using argon and oxygen as reaction gas at sputtering, wherein the oxygen concentration was 0.79 vol %, and by a sputtering apparatus. An ITO film with a thickness of 150 nm was deposited.

Example 2

By the method similar to the method of Example 1, a sample of a translucent substrate (hereinafter referred to as "sample 2") was manufactured.

In this Example 2, the sample was manufactured by setting the condition as follows for depositing the coating layer on the scattering layer.

The coating layer was deposited by reactive sputtering.

The deposition was performed by heating the glass substrate including the scattering layer to 250° C., using a Si target, using argon and oxygen as reaction gas at sputtering, wherein the oxygen concentration was 50 vol %, and by a sputtering apparatus. A $SiO_2$ film of 30 nm was deposited as the coating layer.

Thereafter, similar to the Example 1, the ITO film was deposited.

With this, sample 2 was obtained.

Example 3

By the method similar to the method of Example 1, a sample of a translucent substrate (hereinafter referred to as "sample 3") was manufactured.

In this Example 3, the sample was manufactured by setting the condition as follows for depositing the coating layer on the scattering layer.

The coating layer was deposited by the following steps.

First, liquid for forming a coating layer having an appropriate viscosity for coating was obtained by mixing tetra-normalbutoxide titanate and 3-glycidoxypropyltrimethoxysilane by 40:60 (volume ratio) and diluting it by solvent (1-butanol). The liquid for forming the coating layer was dropped on the scattering layer that was formed on the glass substrate, and formed a coated film using a spin coater.

The coated film was input in a dryer that was retained at 120° C. and retained for 10 minutes to obtain a dry film with a dry film thickness of 0.6 μm.

The dry film was sintered by retaining at 475° C. for 1 hour to obtain a sintered film of 150 nm.

The liquid for forming the coating layer was dropped on the sintered film again, dried and sintered. Then, by stacking two layers, a coating layer formed by a sintered film of 300 nm was obtained.

Thereafter, similar to the Example 1, the ITO film was deposited.

With this, sample 3 was obtained.

Example 4

By the method similar to the method of Example 3, a sample of a translucent substrate (hereinafter referred to as "sample 4") was manufactured.

However, in Example 4, the ITO film was deposited by the following condition. Other conditions are the same as those of Example 3.

The ITO film was deposited similarly by reactive sputtering.

The deposition was performed by heating the substrate on which structures up to the coating layer were formed to 380° C., using an ITO target, using argon and oxygen as reaction gas at sputtering, wherein the oxygen concentration was 2.3 vol %, and by a sputtering apparatus. An ITO film with a thickness of 150 nm was deposited.

With this, sample 4 was obtained.

Example 5

By the method similar to the method of Example 1, a sample of a translucent substrate (hereinafter referred to as "sample 5") was manufactured.

In this Example 5, the sample was manufactured by setting the condition as follows for depositing the coating layer on the scattering layer.

The coating layer was deposited by reactive sputtering.

The deposition was performed by heating the glass substrate including the scattering layer at 250° C., using a 40 at % Si-60 at % Sn target, using argon and oxygen as reaction gas at sputtering, wherein the oxygen concentration was 50 vol %, and by a sputtering apparatus. An STO film (a mixed film containing Si, Sn and O as composition) with a thickness of 300 nm was deposited as the coating layer.

Thereafter, similar to Example 1, the ITO film was deposited.

With this, sample 5 was obtained.

Example 6

By the method similar to the method of Example 1, a sample of a translucent substrate (hereinafter referred to as "sample 6") was manufactured.

In this Example 6, the sample was manufactured by setting the condition as follows for depositing the coating layer on the scattering layer.

The coating layer was deposited by reactive sputtering.

The deposition was performed by heating the glass substrate including the scattering layer at 250° C., using a 40 at % Si-60 at % Sn target, using argon and oxygen as reaction gas at sputtering, wherein the oxygen concentration was 50 vol %, and by a sputtering apparatus. An STO film (a mixed film containing Si, Sn and O as composition) of 150 nm was deposited as the coating layer.

Thereafter, similar to the Example 1, the ITO film was deposited.

With this, sample 6 was obtained.

Example 7

By the method similar to the method of Example 1, a sample of a translucent substrate (hereinafter referred to as "sample 7") was manufactured.

In this example 7, the sample was manufactured by setting the condition as follows for depositing the coating layer on the scattering layer.

The coating layer was deposited by reactive sputtering.

The deposition was performed by heating the glass substrate including the scattering layer to 250° C., using a 28 at % Si-72 at % Sn target, using argon and oxygen as reaction gas at sputtering, wherein the oxygen concentration was 50 vol %, and by a sputtering apparatus. An STO film (a mixed film containing Si, Sn and O as composition) of 300 nm was deposited as a coating layer.

Thereafter, similar to the Example 1, the ITO film was deposited.

With this, sample 7 was obtained.

Example 8

By the method similar to the method of Example 1, a sample of a translucent substrate (hereinafter referred to as "sample 8") was manufactured.

In this Example 8, the sample was manufactured by setting the condition as follows for depositing the coating layer on the scattering layer.

The coating layer was deposited by reactive sputtering.

The deposition was performed by providing the glass substrate including the scattering layer at room temperature, using a 40 at % Si-60 at % Sn target, using argon and oxygen as reaction gas at sputtering, wherein the oxygen concentration was 50 vol %, by a sputtering apparatus. An STO film (a mixed film containing Si, Sn and O as composition) of 300 nm was deposited as a coating layer.

Thereafter, similar to the Example 1, the ITO film was deposited.

With this, sample 8 was obtained.

The depositing method of the coating layer and the result of the evaluation, which will be explained later, of each of samples 1 to 8 are illustrated in Table 1.

The result is illustrated as "SURFACE ROUGHNESS Ra" in Table 1.

(Measurement of Filling Ratio of Coating Layer)

The filling ratio of the coating layer (filling density) was calculated by measuring measured density of the film using an X-ray reflectometer, dividing the measured density by theoretical density calculated by composition of the film and multiplying the obtained value by 100. For the density of the coating film, when there is a density difference in the thickness direction, the highest density in the film was used as the measured density.

The result is illustrated as "FILLING RATIO" in Table 1.

(Coloring Evaluation Test)

The coloring evaluation test was performed by the following steps.

(1) The coating layer and the ITO film of the sample in which the ITO film was deposited were wet etched by iron chloride aqueous solution.

(2) The spectroscopic absorbed amount of the sample was evaluated by a spectroscope (manufactured by PerkinElmer Co., Ltd., Lambda950). The spectroscopic absorbed amount value at this time is illustrated as "ABSORBED AMOUNT

TABLE 1

| SAMPLE No. | DEPOSITING METHOD | COATING LAYER ||| ABSORBED AMOUNT (%) OF BASE MATERIAL TO LIGHT WHOSE WAVELENGTH IS 550 nm AFTER DEPOSITING ITO | EXISTENCE OF ABSORBANCE ORIGINATED FROM Bi REDUCED COMPONENT | ELECTRICAL RESISTIVITY ($\times 10^{-4} \Omega$ cm) | ABSORBED AMOUNT (%) OF SAMPLE TO LIGHT WHOSE WAVELENGTH IS 550 nm | TOTAL EVALUATION |
|---|---|---|---|---|---|---|---|---|---|
| | | REFRACTION INDEX TO LIGHT WHOSE WAVELENGTH IS 550 nm | SURFACE ROUGHNESS Ra (nm) | FILLING RATIO (%) | | | | | |
| 1 | DRY | 1.91 | 1.7 | 98 | 4.4 | NO | 1.31 | 8.2 | ◯ |
| 2 | DRY | 1.47 | 0.6 | 96 | 3.8 | NO | 1.4 | 7.5 | ◯ |
| 3 | WET | 1.91 | 0.5 | 81 | 9.6 | YES | 1.3 | 13.2 | X |
| 4 | WET | 1.91 | 0.6 | 82 | 3.8 | NO | 2.38 | 7.7 | X |
| 5 | DRY | 1.88 | 0.85 | 97 | 4.0 | NO | 1.31 | 6.8 | ◎ |
| 6 | DRY | 1.88 | 0.6 | 99 | 3.8 | NO | 1.31 | 5.7 | ◎ |
| 7 | DRY | 1.86 | 1.8 | 98 | 3.7 | NO | 1.34 | 8.7 | ◯ |
| 8 | DRY | 1.86 | 1.1 | 99 | 3.9 | NO | 1.34 | 8.0 | ◯ |

(Evaluation)

As described above, after depositing the coating layer, the refraction index, the surface roughness (arithmetic mean roughness) Ra and the filling ratio of the coating layer were measured for each of samples 1 to 8. Further, after depositing the ITO film, a coloring evaluation test, an electrical resistivity measurement and an absorbed amount measurement were performed for each of samples 1 to 8. Each of the methods of evaluation and the results are explained in the following.

(Measurement of Refraction Index of Coating Layer)

The refraction index of the coating layer was measured using an ellipsometer (manufactured by J. A. Woollam, Spectroscopic Ellipsometery M-2000DI).

The results are illustrated in Table 1 as "REFRACTION INDEX TO LIGHT WHOSE WAVELENGTH IS 550 nm".

(Measurement of Surface Roughness Ra of Coating Layer)

The surface roughness (arithmetic mean roughness) Ra defined by JIS B 0601 2001 was measured for a surface of the coating layer on which an ITO film was deposited. The surface roughness (arithmetic mean roughness) Ra was measured using an Atomic Force Microscope (manufactured by SEIKO EPSON CORPORATION, SPM3800).

Each of the measurements was performed for a range of 3 μm square at an arbitrary part of the surface of the coating layer.

(%) OF BASE MATERIAL TO LIGHT WHOSE WAVELENGTH IS 550 nm AFTER DEPOSITING ITO" in Table 1.

(3) It is determined that coloring is generated in the base material during the process of depositing the ITO when the absorbed amount at wavelength 550 nm is greater than or equal to that of the base material glass for 1%. Further, in this case, it is determined that absorbance originated from reduction of Bi exists. The result of the coloring evaluation test is illustrated in Table 1 as "EXISTENCE OF ABSORBANCE ORIGINATED FROM BI REDUCED COMPONENT".

Here, when similarly measuring the glass substrate (base material glass) before forming the coating layer and the ITO film, in other words, the glass substrate provided with the scattering layer, the absorbed amount of the glass substrate at wavelength 550 nm was about 3.5%.

(Measurement of Electrical Resistivity)

The electrical resistivity of the ITO film of each of samples 1 to 8 was measured by a Hall effect measuring apparatus. The results are illustrated in Table 1 as "ELECTRICAL RESISTIVITY".

This measurement was performed before performing the coloring evaluation test.

(Measurement of Absorbed Amount)

Next, an absorbed amount of the translucent substrate including the glass substrate, the scattering layer, the coating layer and the ITO film of each of samples 1 to 8 was measured. The measurement of the absorbed amount was performed using a spectroscope (manufactured by PerkinElmer Co., Ltd., Lambda950). The results are illustrated in Table 1 as "ABSORBED AMOUNT (%) OF SAMPLE TO LIGHT WHOSE WAVELENGTH IS 550 nm".

This measurement was performed before performing the coloring evaluation test.

First, according to the result of the coloring evaluation test, it was confirmed that coloring was not generated for each of samples 1, 2, 4, 5, 6, 7 and 8, but coloring was generated for sample 3.

Further, as a result of a measurement of the electrical resistivity, as illustrated in Table 1, it was confirmed that the electrical resistivity was sufficiently small such as less than $2.38 \times 10^{-4}$ Ωcm for each of samples 1, 2, 3, 5, 6, 7 and 8, but the electrical resistivity was high for sample 4.

It can be considered that this is because the ITO film was deposited at a region in which the oxygen concentration was low other than the sample 4, but the ITO film was deposited under an atmosphere in which the oxygen concentration was higher than that of the other samples for sample 4.

By comparing the absorbed amounts of the sample at wavelength 550 nm illustrated in Table 1, it was confirmed that for each of samples 1, 2, 4, 5, 6, 7 and 8, the values are low such as less than or equal to 8.7%, but the value is very high for sample 3 such as 13.2%. It is considered that, as described above, this is because coloring is generated in the scattering layer for sample 3.

Further, it was confirmed that the absorbed amount was very low for samples 5 and 6 compared with other samples, less than or equal to 7.0% for samples 5 and 6, such as 6.8% and 5.7%, respectively.

As illustrated in Table 1, for samples 1, 2 and 5 to 8 in each of which the coating layer was deposited by a dry method, the filling ratio of the coating layer was distributed within a range of 96% to 99%. On the other hand, for samples 3 and 4 in each of which the coating layer was deposited by a wet method, the filling ratio of the coating layer was lowered such as 81% and 82%. Furthermore, by comparing samples 1 to 3 and 5 to 8 in which the oxygen concentration is the same when depositing the ITO film, as described above, coloring was generated only for the case of sample 3.

From the results of the filling ratio of the coating layer and the coloring evaluation test, it can be understood that the coloring of the scattering layer can be prevented by setting the filling ratio of the coating layer high, regardless of the atmosphere when depositing ITO. Further, it was confirmed that the filling ratio of the coating layer can be set high by depositing the coating layer by a dry method.

Further, it was confirmed that the surface roughness Ra of the coating layer surface was lowered such as less than or equal to 2.0 nm for samples 1, 2 and 5 to 8. Among them, for samples 5 and 6 for each of which the absorbed amount of the sample at wavelength 550 nm is less than 7.0%, it was confirmed that the surface roughness of the coating layer was less than or equal to 1.0 nm. This is because the smoother the surface roughness Ra of the coating layer is the more appropriately the crystal nucleus of ITO grew.

Furthermore, by comparing the refraction indexes of the coating layers, the refraction indexes were between 1.86 to 1.91 for the samples other than sample 2, and in these examples, the refraction index of the base material to the light whose wavelength is 550 nm was 1.9 and each of the refraction indexes was close to that of the base material (about 1.9). When the refraction index of the base material and the refraction index of the coating layer are close to each other, the luminescent color of the organic LED does not vary because an interference condition does not change even if there is unevenness of the thickness of the coating layer, and a stable color tone of the light emitting layer can be obtained. Further, the refraction index of the base material is not limited, but in order to appropriately extract light from the organic LED, it is preferable that the refraction index of the base material is greater than or equal to 1.7 and less than or equal to 2.1, and more preferably, greater than or equal to 1.8 and less than or equal to 2.0.

The results were totally evaluated based on the above evaluations. As the reference of the total evaluation, when coloring was not observed in the scattering layer, and the electrical resistivity was sufficiently small, the sample was determined as "o". The sample was determined as "x" in which coloring was observed in the scattering layer or the electrical resistivity is high, as the total evaluation. Further, the sample was determined as a "double circle" in which coloring was not observed in the scattering layer, the electrical resistivity was sufficiently small and the absorbed amount of the sample at wavelength 550 nm was less than or equal to 7.0%, as the total evaluation. The results are illustrated in Table 1.

With these results, for all of the samples 1, 2 and 5 to 8, which were working examples, the total evaluation was "o" or a double circle. In particular, for the samples 5 and 6, it was confirmed that the characteristics were particularly good such as coloring was not observed in the scattering layer, the electrical resistivity was sufficiently low and the absorbed amount of the sample at wavelength 550 nm was less than or equal to 7.0%.

On the other hand, for the samples 3 and 4, which were comparative examples, the total evaluation was "x" as coloring was observed in the scattering layer or the electrical resistivity was high.

As described above, for the samples 1, 2 and 5 to 8, which were working examples, as the coating layer deposited by a dry depositing method functioned as a barrier layer that suppressed the reduction reaction of the reducible element contained in the scattering layer due to the surrounding atmosphere when depositing the ITO film, coloring was not observed in the scattering layer. Further, as the ITO film was deposited under a low oxygen concentration, the electrical resistivity can be sufficiently small.

On the other hand, for the sample 3, which was a comparative example, although the coating layer was provided, it was deposited by a wet depositing method. Thus, the reducible element contained in the scattering layer was reduced by the surrounding atmosphere when depositing the ITO film and coloring was observed in the scattering layer.

Further, for the sample 4, which was a comparative example, as the oxygen concentration of the surrounding atmosphere when depositing the ITO film was set higher than that for other samples, although the coating layer was deposited by a wet depositing method, coloring of the scattering layer was prevented. However, as described above, as the ITO film was deposited under a high oxygen concentration condition, the electrical resistivity became high.

As described above, when depositing the coating layer by a dry depositing method, a dense coating layer can be formed and the coating layer can function as a barrier layer that suppressed the reduction reaction of the reducible element such as $Bi_2O_3$ or the like contained in the scattering layer or the like due to the low oxygen atmosphere when depositing the ITO film. Thus, even when the ITO film is deposited under a low oxygen concentration atmosphere, coloring of the scattering layer can be prevented and it was confirmed that both the low absorbance of the scattering layer (or the glass substrate) and the low resistivity of the ITO film can be obtained.

Although a preferred embodiment of the translucent substrate, the organic LED element and the method of manufacturing the translucent substrate has been specifically illustrated and described, it is to be understood that minor modifications may be made therein without departing from the spirit and scope of the invention as defined by the claims. Numerous variations and modifications may be made without departing from the spirit and scope of the present invention.

INDUSTRIAL APPLICABILITY

The present invention can be adapted to an organic LED element used as a light emitting device or the like.

What is claimed is:

1. A translucent substrate comprising:
a glass substrate comprising at least one element selected from the group consisting of Bi, Ti and Sn;
a coating layer formed on the glass substrate; and
a transparent conductive film formed on the coating layer, wherein the transparent conductive film comprises a film selected from the group consisting of an ITO film, a $SnO_2$ film, a gallium zinc oxide (GZO) film, an indium zinc oxide (IZO) film, an Al doped ZnO film, a Ta doped $SnO_2$ film, and a Ti doped $In_2O_3$ film,
wherein the coating layer is deposited by a dry depositing method,
wherein the degree of oxidation of the transparent conductive film is higher at a side near to the glass substrate than at a side far from the glass substrate,
wherein the coating layer comprises oxide, nitrogen oxide or nitride, containing one or more elements selected from Si, Al, Ti, Nb, Zr, Sn, Ta and W,
wherein a difference between a refraction index of the coating layer and a refraction index of the glass substrate, to light whose wavelength is 550 nm, is greater than or equal to minus 0.15, and less than or equal to plus 0.15,
wherein a filling ratio of the coating layer is greater than or equal to 85%, the filling ratio being calculated by dividing the highest density in the coating layer which is measured using an X-ray reflectometer, by a theoretical density calculated from the composition of the coating layer, and multiplying by 100.

2. The translucent substrate according to claim 1, wherein the degree of oxidation of the transparent conductive film continuously or discontinuously decreases from a side near to the glass substrate to a side far from the glass substrate.

3. The translucent substrate according to claim 1, wherein the thickness of the transparent conductive film is 2 nm to 500 nm.

4. The translucent substrate according to claim 1,
wherein the transparent conductive film is configured with at least two layers of films including a first transparent conductive layer at a side near to the glass substrate and a second transparent conductive layer at a side far from the glass substrate, and
wherein the degree of oxidation of the first transparent conductive layer is higher than that of the second transparent conductive layer.

5. The translucent substrate according to claim 1, wherein the resistivity of the transparent conductive film is less than $2.38 \times 10^{-4}$ $\Omega$cm.

6. The translucent substrate according to claim 1, wherein an attenuation coefficient of the transparent conductive film is less than or equal to 0.0086.

7. An organic LED element comprising a glass substrate, a first electrode layer, an organic light emitting layer and a second electrode layer in this order, comprising:
the translucent substrate according to claim 1.

8. The translucent substrate according to claim 1, wherein a ratio R (vol %·cm²/W) of oxygen partial pressure $P_{O2}$ (vol %) of sputtering gas with respect to plasma power density $P_d$ (W/cm²) upon depositing the transparent conductive film is greater than or equal to 1.03 for a side near the glass substrate and less than or equal to 1.03 for a side far from the glass substrate.

9. A translucent substrate comprising:
a glass substrate;
a scattering layer formed on the glass substrate and comprising at least one element selected from the group consisting of Bi, Ti and Sn;
a coating layer formed on the scattering layer; and
a transparent conductive film formed on the coating layer, wherein the transparent conductive film comprises a film selected from the group consisting of an ITO film, a $SnO_2$ film, a gallium zinc oxide (GZO) film, an indium zinc oxide (IZO) film, an Al doped ZnO film, a Ta doped $SnO_2$ film, and a Ti doped $In_2O_3$ film,
wherein the coating layer is deposited by a dry depositing method,
wherein the degree of oxidation of the transparent conductive film is higher at a side near to the glass substrate than at a side far from the glass substrate,
wherein the coating layer comprises oxide, nitrogen oxide or nitride, containing one or more elements selected from Si, Al, Ti, Nb, Zr, Sn, Ta and W,
wherein a difference between a refraction index of the coating layer and a refraction index of the scattering layer, to light whose wavelength is 550 nm, is greater than or equal to minus 0.15, and less than or equal to plus 0.15,
wherein a filling ratio of the coating layer is greater than or equal to 85%, the filling ratio being calculated by dividing the highest density in the coating layer which is measured using an X-ray reflectometer, by a theoretical density calculated from the composition of the coating layer, and multiplying by 100.

10. A method of manufacturing the translucent substrate according to claim 9, the method comprising:
providing the scattering layer comprising at least one element selected from the group consisting of Bi, Ti and Sn, and further comprising a base material comprising glass and a plurality of scattering substances dispersed in the base material, on the glass substrate;
depositing the coating layer by a dry depositing method on the scattering layer; and
depositing the transparent conductive film on the coating layer, thereby forming the translucent substrate.

11. The translucent substrate according to claim 9, wherein a ratio R (vol %·cm²/W) of oxygen partial pressure $P_{O2}$ (vol %) of sputtering gas with respect to plasma power density $P_d$ (W/cm²) upon depositing the transparent conductive film is greater than or equal to 1.03 for a side near the glass substrate and less than or equal to 1.03 for a side far from the glass substrate.

12. A method of manufacturing the translucent substrate according to claim 1, the method comprising:
preparing the glass substrate comprising at least one element selected from the group consisting of Bi, Ti and Sn;
depositing the coating layer by a dry depositing method on the glass substrate; and
depositing the transparent conductive film on the coating layer, thereby forming the translucent substrate.

13. The method of manufacturing the translucent substrate according to claim 12, wherein in the depositing of the transparent conductive film, the transparent conductive film is deposited such that the degree of oxidation continuously or discontinuously decreases from a side near to the glass substrate to a side far from the glass substrate.

14. The method of manufacturing the translucent substrate according to claim 12, wherein in the depositing of the transparent conductive film, the thickness of the transparent conductive film is 2 nm to 500 nm.

15. The method of manufacturing the translucent substrate according to claim 12, wherein the depositing of the transparent conductive film comprises:
(i) depositing a first transparent conductive layer, and thereafter,
(ii) depositing a second transparent conductive layer on the first transparent conductive layer,
wherein the first transparent conductive layer is deposited such that its degree of oxidation becomes higher than that of the second transparent conductive layer.

16. The method of manufacturing the translucent substrate according to claim 12, wherein the resistivity of the transparent conductive film is less than $2.38 \times 10^{-4}$ Ωcm.

17. The method of manufacturing the translucent substrate according to claim 12, wherein an attenuation coefficient of the transparent conductive film is less than or equal to 0.0086.

* * * * *